US011884801B2

(12) United States Patent
Jun et al.

(10) Patent No.: US 11,884,801 B2
(45) Date of Patent: Jan. 30, 2024

(54) COMPOSITION FOR ENCAPSULANT FILM COMPRISING ETHYLENE/ALPHA-OLEFIN COPOLYMER AND ENCAPSULANT FILM COMPRISING THE SAME

(71) Applicant: LG Chem, Ltd., Seoul (KR)

(72) Inventors: Jung Ho Jun, Daejeon (KR); Eun Jung Lee, Daejeon (KR); Jin Sam Gong, Daejeon (KR); Young Woo Lee, Daejeon (KR); Jin Kuk Lee, Daejeon (KR)

(73) Assignee: LG Chem, Ltd.

( * ) Notice: Subject to any disclaimer, the term of this patent is extended or adjusted under 35 U.S.C. 154(b) by 107 days.

(21) Appl. No.: 17/779,337

(22) PCT Filed: Dec. 8, 2020

(86) PCT No.: PCT/KR2020/017886
§ 371 (c)(1),
(2) Date: May 24, 2022

(87) PCT Pub. No.: WO2021/210749
PCT Pub. Date: Oct. 21, 2021

(65) Prior Publication Data
US 2023/0002597 A1 Jan. 5, 2023

(30) Foreign Application Priority Data

Apr. 16, 2020 (KR) .......................... 10-2020-0046028
Dec. 8, 2020 (KR) .......................... 10-2020-0170553

(51) Int. Cl.
| | | |
|---|---|---|
| C08L 23/08 | (2006.01) | |
| C08F 210/16 | (2006.01) | |
| C08J 3/24 | (2006.01) | |
| C08J 5/18 | (2006.01) | |
| H01L 31/048 | (2014.01) | |

(52) U.S. Cl.
CPC ........ C08L 23/0815 (2013.01); C08F 210/16 (2013.01); C08J 3/24 (2013.01); C08J 5/18 (2013.01); H01L 31/0481 (2013.01); C08F 2810/20 (2013.01); C08J 2323/06 (2013.01); C08L 2203/16 (2013.01); C08L 2203/204 (2013.01); C08L 2312/00 (2013.01)

(58) Field of Classification Search
CPC ........... H01L 31/00–078; C08L 23/0807–0823
USPC ................................................. 136/243–265
See application file for complete search history.

(56) References Cited

U.S. PATENT DOCUMENTS

| | | |
|---|---|---|
| 5,874,513 A | 2/1999 | Watanabe et al. |
| 2002/0143122 A1 | 10/2002 | Laughner et al. |
| 2009/0324914 A1 | 12/2009 | Liang et al. |
| 2010/0113698 A1 | 5/2010 | Walton et al. |
| 2010/0240818 A1 | 9/2010 | Walton et al. |
| 2013/0210990 A1 | 8/2013 | Demirors et al. |
| 2013/0213471 A1 | 8/2013 | Ikenaga et al. |
| 2014/0011974 A1 | 1/2014 | Noh et al. |
| 2014/0096825 A1 | 4/2014 | Bonekamp et al. |
| 2016/0168304 A1 | 6/2016 | Noh et al. |
| 2016/0326281 A1 | 11/2016 | Kim et al. |
| 2018/0016372 A1 | 1/2018 | Kwon et al. |
| 2019/0135963 A1 | 5/2019 | Kim et al. |
| 2020/0362073 A1 | 11/2020 | Park et al. |
| 2020/0385497 A1 | 12/2020 | Kwon et al. |
| 2021/0155727 A1 | 5/2021 | Gwak et al. |

FOREIGN PATENT DOCUMENTS

| | | |
|---|---|---|
| CN | 103502289 A | 1/2014 |
| CN | 107250175 A | 10/2017 |
| CN | 109415459 A | 3/2019 |
| EP | 1214365 B1 | 3/2006 |
| EP | 2637217 A1 | 9/2013 |
| JP | H07118431 A | 5/1995 |
| JP | H10168249 A | 6/1998 |
| JP | 2010258439 A | 11/2010 |
| JP | 2013035937 A | 2/2013 |
| KR | 100372475 B1 | 5/2003 |
| KR | 20110066961 A | 6/2011 |
| KR | 20130064734 A | 6/2013 |
| KR | 20130117638 A | 10/2013 |
| KR | 20140043802 A | 4/2014 |
| KR | 20140147714 A | 12/2014 |
| KR | 101493183 B1 | 2/2015 |
| KR | 20160054849 A | 5/2016 |
| KR | 101797890 B1 | 11/2017 |
| KR | 20190096290 A | 8/2019 |
| KR | 20190127521 A | 11/2019 |
| KR | 20190127564 A | 11/2019 |
| KR | 20190127586 A | 11/2019 |
| KR | 20190127587 A | 11/2019 |
| WO | 2012060086 A1 | 5/2012 |
| WO | 2019125050 A1 | 6/2019 |

OTHER PUBLICATIONS

Search Report dated May 25, 2022 from the Office Action for Chinese Application No. 202011483146.8 dated May 31, 2022, pp. 1-2.
Extended European Search Report including Written Opinion for Application No. 20931132.3 dated Dec. 20, 2022 , pp. 1-11.
Search report from International Application No. PCT/KR2020/017886, dated Mar. 15, 2021.

*Primary Examiner* — Bach T Dinh
(74) *Attorney, Agent, or Firm* — Lerner David LLP

(57) ABSTRACT

The present invention relates to a composition for an encapsulant film including an ethylene/alpha-olefin copolymer having high volume resistance and light transmittance, and an encapsulant film using the same.

15 Claims, No Drawings

COMPOSITION FOR ENCAPSULANT FILM COMPRISING ETHYLENE/ALPHA-OLEFIN COPOLYMER AND ENCAPSULANT FILM COMPRISING THE SAME

CROSS-REFERENCE TO RELATED APPLICATIONS

The present application is a national stage entry under 35 U.S.C. §371 of International Application No. PCT/KR2020/017886 filed on Dec. 8, 2020, which claims priority from Korean Patent Application No. 10-2020-0046028, filed on Apr. 16, 2020, and Korean Patent Application No. 10-2020-0170553, filed on Dec. 8, 2020, all the disclosures of which are incorporated herein by reference.

TECHNICAL FIELD

The present invention relates to a composition for an encapsulant film including an ethylene/alpha-olefin copolymer having high volume resistance and light transmittance, and an encapsulant film using the same.

BACKGROUND ART

As global environmental problems, energy problems, etc. get worse and worse, solar cells receive attention as an energy generating means without fear of environmental contamination and exhaustion. If solar cells are used outside such as the roof of a building, generally, a module type of the solar cells is used. In order to obtain a crystalline solar cell module when manufacturing a solar cell module, protection sheet for solar cell module (surface side protection member)/solar cell encapsulant/crystalline solar cell device/solar cell encapsulant/protection sheet for solar cell module (back side protection member) are stacked in order. In addition, when manufacturing a thin film-based solar cell module, thin film-type solar cell device/solar cell encapsulant/protection sheet for solar cell module (back side protection member) are stacked in order. As the encapsulant of the solar cell, generally, an ethylene/vinyl acetate copolymer or ethylene/alpha-olefin copolymer having excellent transparency, flexibility, adhesiveness, etc. is used.

Meanwhile, the solar cell module is generally used at the outside for a long time, and defects including performance degradation due to various external stimuli are consistently observed. Particularly, the resolution of potential induced degradation (PID) phenomenon found in high-powered power plant types is urgently needed.

In a large-capacity generating system for obtaining high voltage by connecting multiple solar cell modules, the volume resistance of an encapsulant decreases according to the increase of the temperature and humidity at an installed place, and a potential difference is generated between the cell of the solar cells and a frame. At last, toward the end of an array of multiple solar cell modules connected in series, the potential difference between the cell of the solar cells and the frame increases. In the presence of such potential difference, leakage current may be generated, and generating efficiency may be rapidly reduced, and this is called as PID phenomenon.

Based on such backgrounds, the development of an ethylene/alpha-olefin copolymer which may improve volume resistance without degrading light transmittance and may consistently prevent PID phenomenon is required.

PRIOR ART DOCUMENT

Patent Document (Patent Document 1) Japanese Laid-open Patent No. 2010-258439

DISCLOSURE OF THE INVENTION

Technical Problem

An object of the present invention is to provide a composition for an encapsulant film showing high volume resistance and excellent insulation by including an ethylene/alpha-olefin copolymer maintaining a narrow degree of molecular weight distribution and showing high crystallinity distribution.

Another object of the present invention is to provide a method for preparing the composition for an encapsulant film and an encapsulant film manufactured using the composition for an encapsulant film.

Technical Solution

To solve the above tasks, the present invention provides a composition for an encapsulant film including an ethylene/alpha-olefin copolymer satisfying the following conditions (a) to (d):
(a) a density is 0.85 to 0.89 g/cc;
(b) molecular weight distribution is 1.8 to 2.3;
(c) a melt index (MI, 190° C., 2.16 kg load conditions) is 1 to 100 dg/min; and
(d) a full width at half maximum (FWHM) of a crystallization peak shown during measuring a crystallization temperature by cross-fractionation chromatography (CFC) is 15 or more.

In addition, the present invention provides an encapsulant film including the composition for an encapsulant film.

Advantageous Effects

The composition for an encapsulant film of the present invention utilizes an ethylene/alpha-olefin copolymer having high crystallinity distribution and a small free volume, and shows excellent volume resistance and light transmittance, and accordingly, may be widely used for various uses in electric and electronic industrial fields.

BEST MODE FOR CARRYING OUT THE INVENTION

Hereinafter, the present invention will be described in more detail to assist the understanding of the present invention.

It will be understood that words or terms used in the present disclosure and claims shall not be interpreted as the meaning defined in commonly used dictionaries. It will be further understood that the words or terms should be interpreted as having a meaning that is consistent with their meaning in the context of the relevant art and the technical idea of the invention, based on the principle that an inventor may properly define the meaning of the words or terms to best explain the invention.

[Composition for Encapsulant Film]

The composition for an encapsulant film of the present invention is characterized in including an ethylene/alpha-olefin copolymer satisfying the following conditions (a) to (d):

(a) a density is 0.85 to 0.89 g/cc;
(b) molecular weight distribution is 1.8 to 2.3;
(c) a melt index (MI, 190° C., 2.16 kg load conditions) is 1 to 100 dg/min; and
(d) a full width at half maximum (FWHM) of a crystallization peak shown during measuring a crystallization temperature by cross-fractionation chromatography (CFC) is 15 or more.

The present invention relates to a composition for an encapsulant film having high volume resistance and showing excellent electrical insulation. Particularly, for preparing the ethylene/alpha-olefin copolymer included in the composition for an encapsulant film of the present invention, transition metal compounds represented by Formula 1 and Formula 2 are mixed and used as a catalyst. The introduction of an alpha-olefin-based monomer into the transition metal compound represented by Formula 1 is difficult due to the structural characteristics of the catalyst, and a copolymer of a high-density region tends to be prepared, and a large amount of alpha-olefin may be introduced into the transition metal compound represented by Formula 2, a polymer (elastomer) in a very low-density region may be prepared. Accordingly, if each of the two transition metal compounds is used solely, copolymerization properties of mixing and introducing an alpha-olefin-based monomer are different.

The ethylene/alpha-olefin copolymer of the present invention, prepared by using the mixture composition as a catalyst is a copolymer in which both a low-density region in which a large amount of an alpha-olefin-based monomer is mixed and introduced and a high-density region in which a small amount of an alpha-olefin-based monomer is mixed and introduced, are present, and have wide crystallinity distribution and a small free volume, and accordingly, charge mobility is low, and electrical insulation is excellent.

The ethylene/alpha-olefin copolymer included in the composition for an encapsulant film of the present invention is a polymer having a low density in a range of 0.85 to 0.89 g/cc, and in this case, the density may mean a density measured according to ASTM F-792. More particularly, the density may be 0.850 g/cc or more, 0.860 g/cc or more, or 0.870 g/cc or more, or 0.874 g/cc or more, and may be 0.890 g/cc or less, or 0.880 g/cc or less, 0.878 g/cc or less.

If the density deviates from the range, problems of degrading the volume resistance or light transmittance of the ethylene/alpha-olefin copolymer may arise.

Generally, the density of the ethylene/alpha-olefin copolymer is influenced by the type and amount of a monomer used for polymerization, a polymerization degree, etc., and is largely influenced by the amount of a comonomer in case of a copolymer. In this case, if the amount of the comonomer increases, an ethylene/alpha-olefin copolymer of a low density may be prepared, and the amount of the comonomer introduced into the copolymer may be dependent on the intrinsic copolymerization properties of a catalyst.

The ethylene/alpha-olefin copolymer included in the composition for an encapsulant film of the present invention is a copolymer prepared using the compounds represented by Formula 1 and Formula 2 as catalysts, and has a low density as described above, and as a result, excellent processability may be shown.

The ethylene/alpha-olefin copolymer included in the composition for an encapsulant film of the present invention has narrow molecular weight distribution (MWD) in a range of 1.8 to 2.3. More particularly, the molecular weight distribution may be 1.80 or more, 1.90 or more, and 2.30 or less, 2.20 or less, 2.10 or less, 2.05 or less.

Generally, if two or more types of monomers are polymerized, molecular weight distribution increases, and as a result, impact strength and mechanical properties are reduced, and there is possibility of generating blocking phenomenon. Particularly, since the polymerization properties of a monomer are different according to the catalyst, the molecular weight of a polymer finally prepared may be influenced by the type of the catalyst. If two or more types of catalysts are mixed and used in polymerization reaction, and if the difference of the polymerization properties of the catalysts is large, there are problems of increasing the molecular weight distribution of a polymer.

In order to reduce the molecular weight distribution to prevent the degradation of the crosslinking properties, impact strength, mechanical properties, etc. of a copolymer, a suitable amount of hydrogen may be injected during polymerization reaction to prevent the generation of optional β-hydride elimination reaction in a polymer chain and induce uniform termination reaction, and in this case, the weight average molecular weight and melt index of the copolymer tend to decrease according to the injection of hydrogen. Accordingly, appropriate catalyst type and hydrogen injection amount are determined in ranges for achieving both the intrinsic properties of a catalyst structure influencing the weight average molecular weight and the melt index and the reducing effects of molecular weight distribution according to the injection of hydrogen.

Considering the above-described points, in the present invention, since a transition metal compound represented by Formula 1 and a transition metal compound represented by Formula 2 are mixed and used as a catalyst, and an optimum amount of hydrogen is injected during preparation, the above-described range of narrow molecular weight distribution may be obtained, the degradation of crosslinking properties, impact strength, mechanical properties, etc. may be prevented, and high volume resistance and electrical insulation may be achieved.

The weight average molecular weight (Mw) and the number average molecular weight (Mn) are polystyrene conversion molecular weights analyzed by gel permeation chromatography (GPC), and the molecular weight distribution may be calculated from the ratio of Mw/Mn.

In addition, the ethylene/alpha-olefin copolymer may have a weight average molecular weight (Mw) of 40,000 to 150,000 g/mol. More particularly, the weight average molecular weight may be 45,000 g/mol or more, 50,000 g/mol or more, or 60,000 g/mol or more, and 130,000 g/mol or less, 100,000 g/mol or less, or 90,000 g/mol or less.

The ethylene/alpha-olefin copolymer included in the composition for an encapsulant film of the present invention has a meld index (MI, 190° C., 2.16 kg load conditions) of 1 to 100 dg/min. Particularly, the melt index may be 1 dg/min or more, 2 dg/min or more, 3 dg/min or more, or 4 dg/min or more, and 100 dg/min or less, 20 dg/min or less, or 15 dg/min or less.

If the melt index is less than 1 dg/min, a production rate may be reduced due to high load, and if the melt index is greater than 100 dg/min, there are problems in that the volume resistance or light transmittance of the ethylene/alpha-olefin copolymer may be degraded, or film molding is difficult, and the use of an encapsulant composition for a solar cell is unsuitable.

In addition, the ethylene/alpha-olefin copolymer may have a melt flow rate ratio (MFRR, $MI_{10}/MI_{2.16}$) which is a value of melt index ($MI_{10}$) measured at 190° C. and 10 kg load conditions with respect to the melt index ($MI_{2.16}$) measured at 190° C. and 2.16 kg load conditions of 8.0 or less, particularly, 4.0 or more, 4.2 or more, 4.5 or more, and 8.0 or less, 7.0 or less, 6.8 or less. The melt flow rate ratio is an index of the degree of long chain branching of a copolymer, and the ethylene/alpha-olefin copolymer of the present invention satisfies the melt flow rate ratio together with the above-described physical properties and has excellent physical properties, and thus, may be suitably applied to an encapsulant composition for a solar cell with excellent physical properties.

Particularly, if the ethylene/alpha-olefin copolymer of the present invention has a low melt index of 1 to 100 dg/min as described above, the melt flow rate ratio may be low and 8.0 or less. Since the copolymer of the present invention has such a low melt index and melt flow rate ratio, the copolymer is characterized in having a high molecular weight, the small long chain branch content, and an excellent crosslinking degree.

In addition, it is difficult for the conventional copolymer to have such a low melt index and melt flow rate ratio, and at the same time, have a high full width at half maximum (FWHM) of a crystallization peak, which will be explained later, of 15 or more and have wide crystallinity distribution, but in the present invention, since a copolymer is prepared by using the compounds represented by Formula 1 and Formula 2 as catalysts and an appropriate amount of hydrogen, and polymerization is terminated by the injection of hydrogen, the terminal of the copolymer is a saturated state, a long chain branch is not formed, and the characteristics of a low melt flow rate ratio are achieved. Also, a copolymer having wide crystallinity distribution is prepared by using two types of catalysts having different crystallization degree properties.

The ethylene/alpha-olefin copolymer included in the composition for an encapsulant film of the present invention has the full width at half maximum (FWHM) of a crystallization peak shown during measuring a crystallization temperature by cross-fractionation chromatography (CFC) of 15 or more. Here, the full width at half maximum of the peak is a value derived from a crystallinity distribution graph drawn by dw/dT value in accordance with the temperature measured in bivariate distribution by cross-fractionation chromatography.

The cross-fractionation chromatography is a method combining temperature rising elution fractionation (TREF) with gel filtration chromatography (GPC) and is a type of method for getting the crystallinity distribution and molecular weight distribution of a copolymer at the same time.

Particularly, a specimen solution of high temperature in which an ethylene/alpha-olefin copolymer is completely dissolved in a solvent is injected into a column filled with an inert carrier, the temperature of the column is lowered to attach the specimen on the surface of the filler, and the temperature of the column is gradually elevated while flowing o-dichlorobenzene in the column. The concentration of a copolymer eluted at each temperature is detected, and at the same time, the component eluted at each temperature is sent to GPC via online for each fraction to obtain a chromatogram, and after that, the molecular weight distribution of each component is calculated therefrom. In this case, since the elution temperature is elevated according to the increase of the crystallinity of the eluted component, the crystallinity distribution of the copolymer may be found by obtaining the relation of the elution temperature and the elution amount (wt %) of the ethylene/alpha-olefin copolymer.

The ethylene/alpha-olefin copolymer has a high FWHM value of 15 or more, and this indicates that the crystallinity distribution of the copolymer is high. At last, the free volume in the copolymer is small, the charge mobility is low, volume resistance is high, and insulation properties are excellent.

As above, in order to prepare an ethylene/alpha-olefin copolymer having excellent volume resistance and light transmittance, it is important to increase the FWHM value and decrease the molecular weight distribution. The FWHM is related to the uniformity of crystallinity according to the copolymerization properties for mixing and introducing an alpha-olefin-based monomer, and the molecular weight distribution is related to the uniformity of a chain length according to the propagation rate of ethylene, etc. In a catalyst, if a part capable of reacting with a monomer is a single site, the chain propagation may be uniform, and molecular weight distribution may be narrow, but by the same principle, copolymerization properties may be uniform, crystallinity distribution may be narrow, and the FWHM value may become small. Accordingly, the preparation of a copolymer having narrow molecular weight distribution and a high FWHM of 15 or more by using one catalyst is difficult.

On the contrary, by using two types of catalysts having similar propagation rate of ethylene but different copolymerization properties, an ethylene/alpha-olefin copolymer having a high FWHM value of 15 or more and showing narrow molecular weight distribution of 1.8 to 2.3 is prepared.

Particularly, the FWHM value may be 15 or more, 16 or more, 16.5 or more, 16.8 or more, and 50 or less, 40 or less, 30 or less, 25 or less, 21 or less.

In addition, the ethylene/alpha-olefin copolymer included in the composition for an encapsulant film of the present invention may have a melting temperature (Tm) of 70° C. or less. More particularly, the melting temperature may be 50° C. or more, 55° C. or more, 58° C. or more, and 70° C. or less, 68° C. or less, 67° C. or less. By having the melting temperature in such a temperature range, excellent thermal stability may be shown.

In addition, the ethylene/alpha-olefin copolymer may have a crystallization temperature (Tc) of 70° C. or less, 60° C. or less, 55° C. or less, 51° C. or less, and 30° C. or more, 35° C. or more, 40° C. or more, 42° C. or more. Such a low crystallization temperature is due to the non-uniform distribution of a comonomer in the ethylene/alpha-olefin copolymer and high crystallinity distribution, and by having the above-described temperature range, excellent volume resistance and electrical insulation may be shown.

The melting temperature and crystallization temperature may be measured using differential scanning calorimeter (DSC). Particularly, a copolymer is heated to 150° C. and maintained for 5 minutes, and the temperature is reduced to 20° C. again and elevated again. In this case, the elevating rate and decreasing rate of the temperature is controlled to 10° C./min. Measured results in the second temperature elevating section is the melting temperature, and the measured results in a range shown while reducing the temperature is the crystallization temperature.

The ethylene/alpha-olefin copolymer included in the composition for an encapsulant film of the present invention is prepared by copolymerizing ethylene and an alpha-olefin-based monomer, and in this case, the alpha-olefin which means a moiety derived from an alpha-olefin-based monomer in the copolymer may be $C_4$ to $C_{20}$ alpha-olefin, particularly, propylene, 1-butene, 1-pentene, 4-methyl-1-pentene, 1-hexene, 1-heptene, 1-octene, 1-decene, 1-undecene, 1-dodecene, 1-tetradecene, 1-hexadecene, 1-eicosene, etc., and any one among them or mixtures of two or more thereof may be used.

Among them, the alpha-olefin may be 1-butene, 1-hexene or 1-octene, preferably, 1-butene, 1-hexene, or a combination thereof.

In addition, in the ethylene/alpha-olefin copolymer, the alpha-olefin content may be suitably selected in the range satisfying the physical conditions, particularly, greater than 0 to 99 mol %, or 10 to 50 mol %, without limitation.

In addition, by using the composition for an encapsulant film of the present invention, a modified resin composition, for example, a silane modified resin composition or an amino silane modified resin composition may be prepared.

Particularly, the composition for an encapsulant film may include a known crosslinking agent, crosslinking auxiliary agent, silane coupling agent, etc., in addition to the ethylene/alpha-olefin copolymer.

The crosslinking agent is a radical initiator in the preparation step of the silane modified resin composition, and may play the role of initiating graft reaction of an unsaturated silane composition onto a resin composition. In addition, by forming a crosslinking bond in the silane modified resin composition, or between the silane modified resin composition and an unmodified resin composition during a lamination step for manufacturing an optoelectronic device, the heat resistant durability of a final product, for example, an encapsulant sheet may be improved.

The crosslinking agent may use various crosslinking agents well-known in this technical field only if it is a crosslinking compound capable of initiating the radical polymerization of a vinyl group or forming a crosslinking bond, for example, one or two or more selected from the group consisting of organic peroxides, hydroxyl peroxides and azo compounds.

Particularly, one or more selected from the group consisting of dialkyl peroxides such as t-butylcumylperoxide, di-t-butyl peroxide, di-cumyl peroxide, 2,5-dimethyl-2,5-di(t-butylperoxy)hexane, and 2,5-dimethyl-2,5-di(t-butylperoxy)-3-hexyne; hydroperoxides such as cumene hydroperoxide, diisopropyl benzene hydroperoxide, 2,5-dimethyl-2,5-di(hydroperoxy)hexane, and t-butyl hydroperoxide; diacyl peroxides such as bis-3,5,5-trimethylhexanoyl peroxide, octanoyl peroxide, benzoyl peroxide, o-methylbenzoyl peroxide, and 2,4-dichlorobenzoyl peroxide; peroxy esters such as t-butylperoxy isobutyrate, t-butylperoxy acetate, t-butylperoxy-2-ethylhexylcarbonate (TBEC), t-butylperoxy-2-ethylhexanoate, t-butylperoxy pyvalate, t-butylperoxy octoate, t-butylperoxyisopropyl carbonate, t-butylperoxybenzoate, di-t-butylperoxyphthalate, 2,5-dimethyl-2,5-di(benzoylperoxy)hexane, and 2,5-dimethyl-2,5-di(benzoylperoxy)-3-hexyne; ketone peroxides such as methyl ethyl ketone peroxide and cyclohexanone peroxide, lauryl peroxide, and azo compounds such as azobisisobutyronitrile and azobis(2,4-dimethylvaleronitrile), may be used, without limitation.

The organic peroxide may be an organic peroxide having a one-hour half-life temperature of 120 to 135° C., for example, 120 to 130° C., 120 to 125° C., preferably, 121° C. The "one-hour half-life temperature" means a temperature at which the half-life of the crosslinking agent becomes one hour. According to the one-hour half-life temperature, the temperature at which radical initiation reaction is efficiently performed may become different. Therefore, in case of using the organic peroxide having the one-hour half-life temperature in the above-described range, radical initiation reaction, that is, crosslinking reaction in a lamination process temperature for manufacturing an optoelectronic device may be effectively performed.

The crosslinking agent may be included in 0.01 to 1 parts by weight, for example, 0.05 to 0.55, 0.1 to 0.5 or 0.15 to 0.45 parts by weight based on 100 parts by weight of the composition for an encapsulant film. If the crosslinking agent is included in less than 0.01 parts by weight, heat resistant properties may be insignificant, and if the amount is greater than 1 part by weight, the moldability of an encapsulant sheet is deteriorated, problems generating process limitation may arise, and physical properties of an encapsulant may be influenced.

In addition, the resin composition may include a crosslinking auxiliary agent in addition to the crosslinking agent. By including the crosslinking auxiliary agent in the resin composition, the crosslinking degree in the resin composition by the crosslinking auxiliary agent may be increased, and accordingly, the heat resistant durability of a final product, for example, an encapsulant sheet may be improved even further.

The crosslinking auxiliary agent may use various crosslinking auxiliary agents well-known in this technical field. For example, as the crosslinking auxiliary agent, a compound containing at least one or more unsaturated groups such as an allyl group and a (meth)acryloxy group may be used.

The compound containing the allyl group may include, for example, a polyallyl compound such as triallyl isocyanurate (TAIC), triallyl cyanurate, diallyl phthalate, diallyl fumarate and diallyl maleate, and the compound containing the (meth)acryloxy group may include a poly(meth)acryloxy compound such as ethylene glycol diacrylate, ethylene glycol dimethacrylate, and trimethylolpropane trimethacryate, without limitation.

The crosslinking auxiliary agent may be included in an amount of 0.01 to 0.5 parts by weight, for example, 0.01 to 0.3, 0.015 to 0.2, or 0.016 to 0.16 parts by weight based on 100 parts by weight of the composition for an encapsulant film. If the crosslinking auxiliary agent is included in less than 0.01 parts by weight, the improving effects of heat resistant properties may be insignificant, and if the amount is greater than 0.5 parts by weight, problems of affecting the physical properties of a final product, for example, an encapsulant sheet may be generated, and the production cost may increase.

In addition, the composition for an encapsulant film may additionally include a silane coupling agent in addition to the ethylene/alpha-olefin copolymer, the crosslinking agent and the crosslinking auxiliary agent.

The silane coupling agent may use, for example, one or more selected from the group consisting of N-(β-aminoethyl)-γ-aminopropyltrimethoxysilane, N-(β-aminoethyl)-γ-aminopropylmethyldimethoxysilane, γ-aminopropyltriethoxysilane, γ-glycidoxypropyltrimethoxysilane, and γ-methacryloxypropyltrimethoxysilane (MEMO).

The silane coupling agent may be included in 0.1 to 0.4 parts by weight based on 100 parts by weight of the composition for an encapsulant film. If the amount used is less than 0.3, adhesiveness with glass during manufacturing a solar cell module may become poor, and water penetration may become easy, and thus, the long-term performance of the module may not be secured. If the amount is more than 1 part by weight, it acts as an increasing factor of Y.I, undesirably.

In addition, the composition of an encapsulant film may additionally include an unsaturated silane compound and an amino silane compound.

The unsaturated silane compound may be grafted into a main chain including the polymerization unit of the monomer of the copolymer of the present invention in the presence of a radical initiator, etc., and included in a polymerized type in a silane modified resin composition or an amino silane modified resin composition.

The unsaturated silane compound may be vinyltrimethoxy silane, vinyltriethoxy silane, vinyltripropoxy silane, vinyltriisopropoxy silane, vinyltributoxy silane, vinyltripentoxy silane, vinyltriphenoxy silane, or vinyltriacetoxy silane, and in an embodiment, vinyltrimethoxy silane or vinyltriethoxy silane may be used among them, without limitation.

In addition, the amino silane compound may act as a catalyst for promoting hydrolysis reaction for converting an unsaturated silane compound grafted in the main chain of the copolymer, for example, a reactive functional group such as the alkoxy group of vinyltriethoxy silane into a hydroxyl group in the grafting modification step of the ethylene/alpha-olefin copolymer, to improve the adhesive strength of upper and lower glass substrates or with a back sheet composed of a fluorine resin, etc. At the same time, the amino silane compound may be directly involved as a reactant in copolymerization reaction and may provide an amino modified resin composition with a moiety having an amine functional group.

The amino silane compound is a silane compound including an amine group and is not specifically limited as long as it is a primary amine or a secondary amine. For example, the amino silane compound may use aminotrialkoxysilane, aminodialkoxysilane, etc., and examples may include one or more selected from the group consisting of 3-aminopropyltrimethoxysilane (APTMS), 3-aminopropyltriethoxysilane (APTES), bis[(3-triethoxysilyl)propyl]amine, bis[(3-trimethoxysilyl)propyl]amine, 3-aminopropylmethyldiethoxysilane, 3-aminopropylmethyldimethoxysilane, N-[3-(trimethoxysilyl)propyl]ethylenediamine (DAS), aminoethylaminopropyltriethoxysilane, aminoethylaminopropylmethyldimethoxysilane, aminoethylaminopropylmethyldiethoxysilane, aminoethylaminomethyltriethoxysilane, aminoethylaminomethylmethyldiethoxysilane, diethylenetriaminopropyltrimethoxysilane, diethylenetriaminopropyltriethoxysilane, diethylenetriaminopropylmethyldimethoxysilane, diethyleneaminomethylmethyldiethoxysilane, (N-phenylamino)methyltrimethoxysilane, (N-phenylamino)methyltriethoxysilane, (N-phenylamino)methylmethyldimethoxysilane, (N-phenylamino)methylmethyldiethoxysilane, 3-(N-phenylamino)propyltrimethoxysilane, 3-(N-phenylamino)propyltriethoxysilane, 3-(N-phenylamino)propylmethyldimethoxysilane, 3-(N-phenylamino)propylmethyldiethoxysilane, and N—(N-butyl)-3-aminopropyltrimethoxysilane. The amino silane compound may be used alone or as a mixture type.

The amounts of the unsaturated silane compound and/or the amino silane compound are not specifically limited.

In addition, the composition for an encapsulant film may additionally include one or more additives selected from a light stabilizer, a UV absorbent or a thermal stabilizer as necessary.

The light stabilizer may capture the active species of the photothermal initiation of a resin to prevent photooxidation according to the use applied of the composition. The type of the light stabilizer used is not specifically limited, and for example, known compounds such as a hindered amine-based compound and a hindered piperidine-based compound may be used.

The UV absorbent absorbs ultraviolet rays from the sunlight, etc. and transform into harmless thermal energy in a molecule, and may play the role of preventing the excitation of the active species of photothermal initiation in the resin composition. Particular types of the UV absorbent used are not specifically limited, and for example, one or a mixture of two or more of benzophenone-based, benzotriazole-based, acrylnitrile-based, metal complex-based, hindered amine-based, inorganic including ultrafine particulate titanium oxide and ultrafine particulate zinc oxide UV absorbents, etc. may be used.

In addition, the thermal stabilizer may include a phosphor-based thermal stabilizer such as tris(2,4-di-tert-butylphenyl)phosphite, phosphorous acid, bis[2,4-bis(1,1-dimethylethyl)-6-methylphenyl]ethylester, tetrakis(2,4-di-tert-butylphenyl) [1,1-biphenyl]-4,4'-diylbisphosphonate and bis(2,4-di-tert-butylphenyl)pentaerythritol diphosphite; and a lactone-based thermal stabilizer such as the reaction product of 8-hydroxy-5,7-di-tert-butyl-furan-2-on and o-xylene, and one or two or more of them may be used.

The amounts of the light stabilizer, UV absorbent and/or thermal stabilizer are not specifically limited. That is, the amounts of the additives may be suitably selected considering the use of the resin composition, the shape or density of the additives, etc. Generally, the amounts may be suitably controlled in a range of 0.01 to 5 parts by weight based on 100 parts by weight of the total solid content of the composition for an encapsulant film.

In addition, the composition for an encapsulant film of the present invention may additionally include various additives well-known in this art according to the use of the resin component applied in addition to the above components.

In addition, the composition for an encapsulant film may be utilized in various molded articles by molding by injection, extrusion, etc. Particularly, the composition may be used in various optoelectronic devices, for example, as an encapsulant for the encapsulation of a device in a solar cell, and may be used as an industrial material applied in a lamination process with heating, etc., without limitation.

[Method for Preparing Composition for Encapsulant Film]

The method for preparing the composition for an encapsulant film of the present invention is characterized in including a step of polymerizing ethylene and an alpha-olefin-based monomer in the presence of a catalyst composition including transition metal compounds represented by Formula 1 and Formula 2 below to prepare an ethylene/alpha-olefin copolymer; and a step of mixing the ethylene/alpha-olefin copolymer with a crosslinking agent, a crosslinking auxiliary agent and a silane coupling agent.

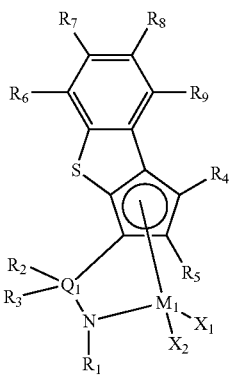

[Formula 1]

In Formula 1,

R₁ is hydrogen; alkyl of 1 to 20 carbon atoms; cycloalkyl of 3 to 20 carbon atoms; alkenyl of 2 to 20 carbon atoms; alkoxy of 1 to 20 carbon atoms; aryl of 6 to 20 carbon atoms; arylalkoxy of 7 to 20 carbon atoms; alkylaryl of 7 to 20 carbon atoms; or arylalkyl of 7 to 20 carbon atoms, R₂ and R₃ are each independently hydrogen; halogen; alkyl of 1 to 20 carbon atoms; cycloalkyl of 3 to 20 carbon atoms; alkenyl of 2 to 20 carbon atoms; arylalkyl of 7 to 20 carbon atoms; alkylamido of 1 to 20 carbon atoms; or arylamido of 6 to 20 carbon atoms, R₄ and R₅ are each independently hydrogen; alkyl of 1 to 20 carbon atoms; cycloalkyl of 3 to 20 carbon atoms; aryl of 6 to 20 carbon atoms; or alkenyl of 2 to 20 carbon atoms, R₆ to R₉ are each independently hydrogen; alkyl of 1 to 20 carbon atoms; cycloalkyl of 3 to 20 carbon atoms; aryl of 6 to 20 carbon atoms; or alkenyl of 2 to 20 carbon atoms, two or more adjacent groups among R₆ to R₉ may be connected with each other to form a ring, Q₁ is Si, C, N, P or S, M₁ is Ti, Hf or Zr, and X₁ and X₂ are each independently hydrogen; halogen; alkyl of 1 to 20 carbon atoms; alkenyl of 2 to 20 carbon atoms; aryl of 6 to 20 carbon atoms; alkylaryl of 7 to 20 carbon atoms; arylalkyl of 7 to 20 carbon atoms; alkylamino of 1 to 20 carbon atoms; or arylamino of 6 to 20 carbon atoms.

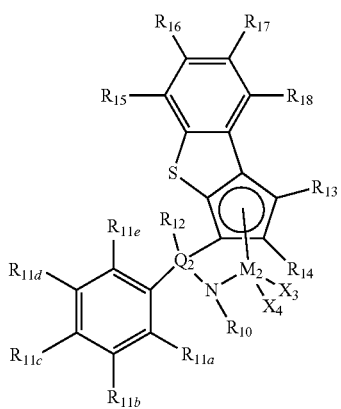

[Formula 2]

In Formula 2,

R₁₀ is hydrogen; alkyl of 1 to 20 carbon atoms; cycloalkyl of 3 to 20 carbon atoms; alkenyl of 2 to 20 carbon atoms; alkoxy of 1 to 20 carbon atoms; aryl of 6 to 20 carbon atoms; arylalkoxy of 7 to 20 carbon atoms; alkylaryl of 7 to 20 carbon atoms; or arylalkyl of 7 to 20 carbon atoms, $R_{11a}$ to $R_{11e}$ are each independently hydrogen; halogen; alkyl of 1 to 20 carbon atoms; cycloalkyl of 3 to 20 carbon atoms; alkenyl of 2 to 20 carbon atoms; alkoxy of 1 to 20 carbon atoms; or aryl of 6 to 20 carbon atoms, R₁₂ is hydrogen; halogen; alkyl of 1 to 20 carbon atoms; cycloalkyl of 3 to 20 carbon atoms; alkenyl of 2 to 20 carbon atoms; aryl of 6 to 20 carbon atoms; alkylaryl of 7 to 20 carbon atoms; arylalkyl of 7 to 20 carbon atoms; alkylamido of 1 to 20 carbon atoms; or arylamido of 6 to 20 carbon atoms, R₁₃ and R₁₄ are each independently hydrogen; alkyl of 1 to 20 carbon atoms; cycloalkyl of 3 to 20 carbon atoms; aryl of 6 to 20 carbon atoms; or alkenyl of 2 to 20 carbon atoms, R₁₅ to R₁₈ are each independently hydrogen; alkyl of 1 to 20 carbon atoms; cycloalkyl of 3 to 20 carbon atoms; aryl of 6 to 20 carbon atoms; or alkenyl of 2 to 20 carbon atoms, two or more adjacent groups among R₁₅ to R₁₈ may be connected with each other to form a ring, Q₂ is Si, C, N, P or S, M₂ is Ti, Hf or Zr, and X₃ and X₄ are each independently hydrogen; halogen; alkyl of 1 to 20 carbon atoms; alkenyl of 2 to 20 carbon atoms; aryl of 6 to 20 carbon atoms; alkylaryl of 7 to 20 carbon atoms; arylalkyl of 7 to 20 carbon atoms; alkylamino of 1 to 20 carbon atoms; or arylamino of 6 to 20 carbon atoms.

Particularly, in Formula 1, R₁ is hydrogen; alkyl of 1 to 20 carbon atoms; cycloalkyl of 3 to 20 carbon atoms; alkenyl of 2 to 20 carbon atoms; alkoxy of 1 to 20 carbon atoms; aryl of 6 to 20 carbon atoms; arylalkoxy of 7 to 20 carbon atoms; alkylaryl of 7 to 20 carbon atoms; or arylalkyl of 7 to 20 carbon atoms, and more particularly, R₁ may be methyl, ethyl, propyl, butyl, isobutyl, tert-butyl, isopropyl, cyclohexyl, benzyl, phenyl, methoxyphenyl, ethoxyphenyl, fluorophenyl, bromophenyl, chlorophenyl, dimethylphenyl or diethylphenyl.

Particularly, in Formula 1, R₂ and R₃ are each independently hydrogen; halogen; alkyl of 1 to 20 carbon atoms; cycloalkyl of 3 to 20 carbon atoms; alkenyl of 2 to 20 carbon atoms; arylalkyl of 7 to 20 carbon atoms; alkylamido of 1 to 20 carbon atoms; or arylamido of 6 to 20 carbon atoms, and more particularly, R₂ and R₃ may be each independently hydrogen; alkyl of 1 to 20 carbon atoms; or arylalkyl of 7 to 20 carbon atoms.

Particularly, in Formula 1, R₄ and R₅ may be the same or different, and may be each independently hydrogen; alkyl of 1 to 20 carbon atoms; cycloalkyl of 3 to 20 carbon atoms; aryl of 6 to 20 carbon atoms; or alkenyl of 2 to 20 carbon atoms, more particularly, alkyl of 1 to 6 carbon atoms. More particularly, R₄ and R₅ may be methyl, ethyl or propyl.

Particularly, in Formula 1, R₆ to R₉ may be the same or different and may be each independently hydrogen; alkyl of 1 to 20 carbon atoms; cycloalkyl of 3 to 20 carbon atoms; aryl of 6 to 20 carbon atoms; or alkenyl of 2 to 20 carbon atoms. More particularly, R₆ to R₉ may be the same or different and may be each independently hydrogen or methyl.

Two or more adjacent groups among R₆ to R₉ may be connected with each other to form an aliphatic ring of 5 to 20 carbon atoms or an aromatic ring of 6 to 20 carbon atoms, and the aliphatic ring or aromatic ring may be substituted with halogen, alkyl of 1 to 20 carbon atoms, alkenyl of 2 to 20 carbon atoms or aryl of 6 to 20 carbon atoms.

Particularly, in Formula 1, $Q_1$ is Si, C, N, P or S, and more particularly, $Q_1$ may be Si.

Particularly, in Formula 1, $M_1$ may be Ti, Hf or Zr.

Particularly, in Formula 1, $X_1$ and $X_2$ may be the same or different and may be each independently hydrogen; halogen; alkyl of 1 to 20 carbon atoms; alkenyl of 2 to 20 carbon atoms; aryl of 6 to 20 carbon atoms; alkylaryl of 7 to 20 carbon atoms; arylalkyl of 7 to 20 carbon atoms; alkylamino of 1 to 20 carbon atoms; or arylamino of 6 to 20 carbon atoms.

In addition, the compound represented by Formula 1 may be a compound represented by any one among the compounds below.

[Formula 1-1]

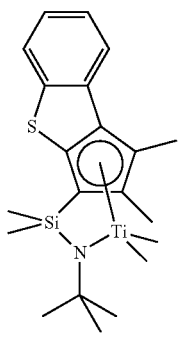

[Formula 1-2]

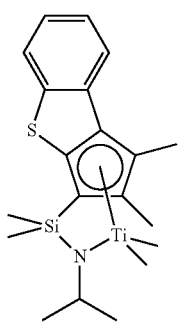

[Formula 1-3]

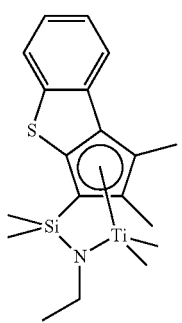

[Formula 1-4]

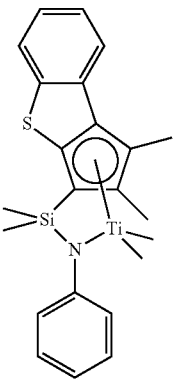

[Formula 1-5]

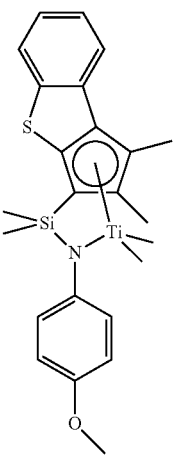

[Formula 1-6]

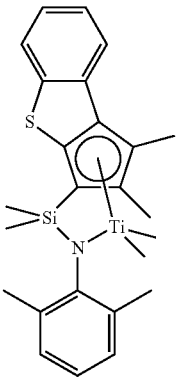

Besides, the compounds may have various structures within the range defined in Formula 1.

In addition, in Formula 2, $R_{10}$ is hydrogen; alkyl of 1 to 20 carbon atoms; cycloalkyl of 3 to 20 carbon atoms; alkenyl of 2 to 20 carbon atoms; alkoxy of 1 to 20 carbon atoms; aryl of 6 to 20 carbon atoms; arylalkoxy of 7 to 20 carbon atoms; alkylaryl of 7 to 20 carbon atoms; or arylalkyl of 7 to 20 carbon atoms, and more particularly, $R_{10}$ may be hydrogen; alkyl of 1 to 20 carbon atoms or 1 to 12 carbon atoms; alkoxy of 1 to 20 carbon atoms; aryl of 6 to 20 carbon atoms; arylalkoxy of 7 to 20 carbon atoms; alkylaryl of 7 to 20 carbon atoms; or arylalkyl of 7 to 20 carbon atoms.

Particularly, in Formula 2, $R_{11a}$ to $R_{11e}$ are each independently hydrogen; halogen; alkyl of 1 to 20 carbon atoms; cycloalkyl of 3 to 20 carbon atoms; alkenyl of 2 to 20 carbon atoms; alkoxy of 1 to 20 carbon atoms; or aryl of 6 to 20 carbon atoms, more particularly, hydrogen; halogen; alkyl of 1 to 12 carbon atoms; cycloalkyl of 3 to 12 carbon atoms; alkenyl of 2 to 12 carbon atoms; alkoxy of 1 to 12 carbon atoms; or phenyl.

Particularly, in Formula 2, $R_{12}$ is hydrogen; halogen; alkyl of 1 to 20 carbon atoms; cycloalkyl of 3 to 20 carbon atoms; alkenyl of 2 to 20 carbon atoms; aryl of 6 to 20 carbon atoms; alkylaryl of 7 to 20 carbon atoms; arylalkyl of 7 to 20 carbon atoms; alkylamido of 1 to 20 carbon atoms; or arylamido of 6 to 20 carbon atoms, more particularly, hydrogen; halogen; alkyl of 1 to 12 carbon atoms; cycloalkyl of 3 to 12 carbon atoms; alkenyl of 2 to 12 carbon atoms; or phenyl.

Particularly, in Formula 2, $R_{13}$ and $R_{14}$ are each independently hydrogen; alkyl of 1 to 20 carbon atoms; cycloalkyl of 3 to 20 carbon atoms; aryl of 6 to 20 carbon atoms; or alkenyl of 2 to 20 carbon atoms, more particularly, hydrogen; or alkyl of 1 to 12 carbon atoms.

Particularly, in Formula 2, $R_{15}$ to $R_{18}$ are each independently hydrogen; alkyl of 1 to 20 carbon atoms; cycloalkyl of 3 to 20 carbon atoms; aryl of 6 to 20 carbon atoms; or alkenyl of 2 to 20 carbon atoms, more particularly, hydrogen; alkyl of 1 to 12 carbon atoms; or cycloalkyl of 3 to 12 carbon atoms, or hydrogen; or methyl.

Particularly, in Formula 2, two or more adjacent groups among $R_{15}$ to $R_{18}$ may be connected with each other to form a ring.

Particularly, in Formula 2, $Q_2$ is Si, C, N, P or S, more particularly, Q may be Si.

Particularly, in Formula 2, $X_3$ and $X_4$ are each independently hydrogen; halogen; alkyl of 1 to 20 carbon atoms; alkenyl of 2 to 20 carbon atoms; aryl of 6 to 20 carbon atoms; alkylaryl of 7 to 20 carbon atoms; arylalkyl of 7 to 20 carbon atoms; alkylamino of 1 to 20 carbon atoms; or arylamino of 6 to 20 carbon atoms, particularly, hydrogen; halogen; alkyl of 1 to 12 carbon atoms; cycloalkyl of 3 to 12 carbon atoms; or alkenyl of 2 to 12 carbon atoms, more particularly, hydrogen; or alkyl of 1 to 12 carbon atoms.

In addition, the compound represented by Formula 2 may be any one among the compounds represented by Formula 2-1 to Formula 2-10 below.

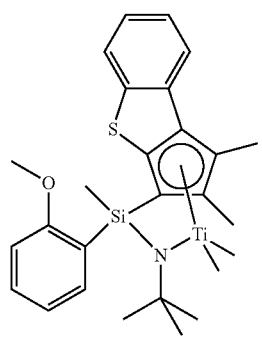

[ Formula 2-1 ]

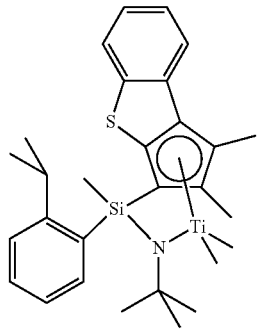

[ Formula 2-2 ]

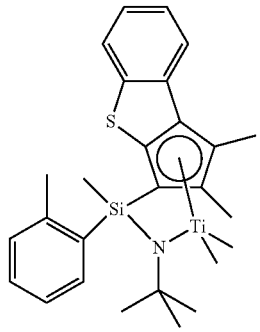

[ Formula 2-3 ]

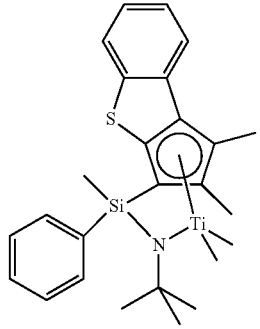

[ Formula 2-4 ]

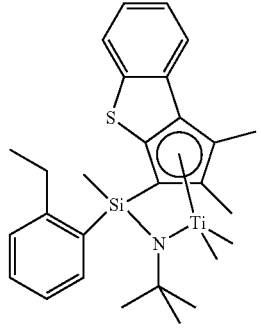

[ Formula 2-5 ]

[Formula 2-6]

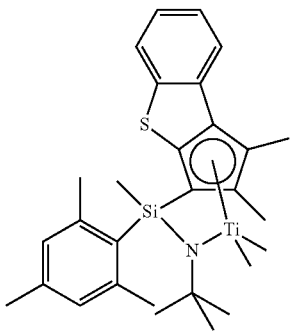

[Formula 2-7]

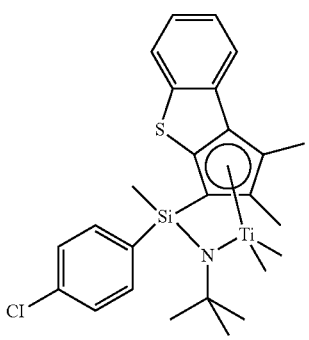

[Formula 2-8]

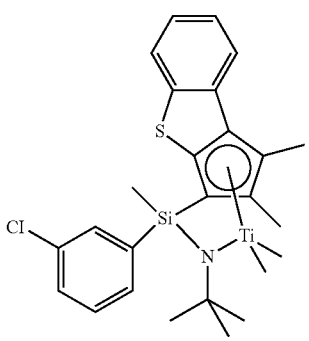

[Formula 2-9]

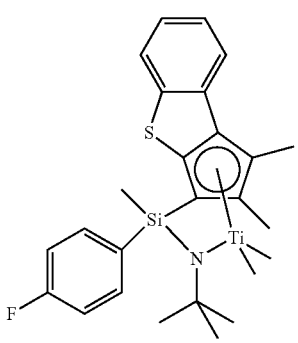

[Formula 2-10]

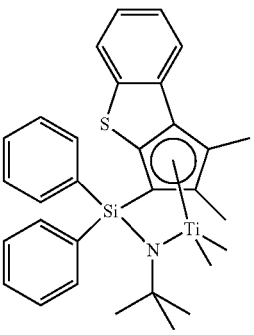

In the present invention, the molar ratio of the transition metal compounds represented by Formula 1 and Formula 2 may be 1:0.8 to 1:10, or 1:1 to 1:9, without limitation.

As described above, the transition metal compounds represented by Formula 1 and Formula 2 used in the present invention have different mixing and introducing capacity of a comonomer, and by mixing and using them, a copolymer having both a low-density region and a high-density region and high crystallinity distribution may be prepared, and the copolymer of the present invention thus prepared may show high crystallinity distribution, a small free volume, and excellent electrical insulation.

In the present invention, the polymerization reaction may be performed by continuously polymerizing ethylene and an alpha-olefin-based monomer by continuously injecting hydrogen in the presence of the catalyst composition, particularly, may be performed by injecting hydrogen in 5 to 100 cc/min.

The hydrogen gas plays the role of restraining vigorous reaction of the transition metal compounds at the initiation point of polymerization and terminating polymerization reaction. Accordingly, by the use of the hydrogen gas and the control of the amount used, an ethylene/alpha-olefin copolymer having narrow molecular weight distribution may be effectively prepared.

For example, the hydrogen may be injected in 5 cc/min or more, 7 cc/min or more, or 10 cc/min or more, or 15 cc/min or more, or 19 cc/min or more, and 100 cc/min or less, or 50 cc/min or less, or 45 cc/min or less, or 35 cc/min or less, or 29 cc/min or less. If injected in the above-described conditions, the ethylene/alpha-olefin copolymer thus prepared may achieve the physical properties of the present invention.

If the hydrogen gas is injected in less than 5 cc/min, the termination of polymerization reaction is not uniformly carried out, and the preparation of an ethylene/alpha-olefin copolymer having desired physical properties may become difficult, and if injected in greater than 100 cc/min, termination reaction may occur too fast, and it is apprehended that an ethylene/alpha-olefin copolymer having a very low molecular weight may be prepared.

In addition, the polymerization reaction may be performed at 100 to 200° C., and by controlling the polymerization temperature together with the injection amount of hydrogen, the crystallinity distribution and the molecular weight distribution in the ethylene/alpha-olefin copolymer may be controlled more advantageously. Particularly, the polymerization reaction may be performed at 100 to 200° C., 120 to 180° C., 130 to 170° C., or 130 to 150° C., without limitation.

In the present invention, a co-catalyst may be additionally used in the catalyst composition for activating the transition metal compounds represented by Formula 1 and/or Formula 2. The co-catalyst is an organometallic compound including a metal in group 13, and may particularly include one or more selected from Formula 3 to Formula 5 below.

$$—[Al(R_{19})—O]_a—$$ [Formula 3]

In Formula 3, each $R_{19}$ is independently halogen radical; hydrocarbyl radical of 1 to 20 carbon atoms; or halogen-substituted hydrocarbyl radical of 1 to 20 carbon atoms, and a is an integer of 2 or more.

$$D(R_{19})_3$$ [Formula 4]

In Formula 4,

D is aluminum or boron, and each $R_{19}$ is independently halogen radical; hydrocarbyl radical of 1 to 20 carbon atoms; or halogen-substituted hydrocarbyl radical of 1 to 20 carbon atoms.

$$[L-H]^+[Z(A)_4]^- \text{ or } [L]^+[Z(A)_4]^-$$ [Formula 5]

In Formula 5,

H is a hydrogen atom,

Z is an element in group 13, each A is independently aryl of 6 to 20 carbon atoms, in which one or more hydrogen atoms may be substituted with substituents; or alkyl of 1 to 20 carbon atoms, the substituent is halogen; hydrocarbyl of 1 to 20 carbon atoms; alkoxy of 1 to 20 carbon atoms; or aryloxy of 6 to 20 carbon atoms, $[L-H]^+$ is trimethylammonium; triethylammonium; tripropylammonium; tributylammonium; diethylammonium; trimethylphosphonium; or triphenylphosphonium, and $[L]^+$ is N,N-diethylanilinium; or triphenylcarbonium.

More particularly, the compound of Formula 3 may be an alkylaluminoxane-based compound in which repeating units are combined in a linear, circular or network shape, and particular example may include methylaluminoxane (MAO), ethylaluminoxane, isobutylaluminoxane or tert-butylaluminoxane.

In addition, the compound of Formula 4 may include trimethylaluminum, triethylaluminum, triisobutylaluminum, tripropylaluminum, tributylaluminum, dimethylchloroaluminum, triisopropylaluminum, tri-s-butylaluminum, tricyclopentylaluminum, tripentylaluminum, triisopentylaluminum, trihexylaluminum, trioctylaluminum, ethyldimethylaluminum, methyldiethylaluminum, triphenylaluminum, tri-p-tolylaluminum, dimethylaluminummethoxide, dimethylaluminumethoxide, trimethylboron, triethylboron, triisobutylboron, tripropylboron, tributylboron, etc. particularly, trimethylaluminum, triethylaluminum or triisobutylaluminum, without limitation.

In addition, the compound of Formula 5 may include a borate-based compound of a trisubstituted ammonium salt, a dialkyl ammonium salt or a trisubstituted phosphonium salt type. More particular examples include a borate-based compound of a trisubstituted ammonium salt type such as trimethylammonium tetraphenylborate, methyldioctadecylammonium tetraphenylborate, triethylammonium tetraphenylborate, tripropylammonium tetraphenylborate, tri(n-butyl)ammonium tetraphenylborate, methyltetradecylcyclooctadecylammonium tetraphenylborate, N,N-dimethylanilinium tetraphenylborate, N,N-diethylanilinium tetraphenylborate, N,N-dimethyl(2,4,6-trimethylanilinium)tetraphenylborate, trimethylammonium tetrakis(pentafluorophenyl)borate, methylditetradecylammonium tetrakis(pentaphenyl)borate, methyldioctadecylammonium tetrakis(pentafluorophenyl)borate, triethylammonium, tetrakis(pentafluorophenyl)borate, tripropylammoniumtetrakis (pentafluorophenyl)borate, tri(n-butyl)ammonium tetrakis (pentafluorophenyl)borate, tri(sec-butyl)ammoniumtetrakis (pentafluorophenyl)borate, N,N-dimethylanilinium tetrakis (pentafluorophenyl)borate, N,N-diethylaniliniumtetrakis (pentafluorophenyl)borate, N,N-dimethyl (2,4,6-trimethylanilinium)tetrakis(pentafluorophenyl)borate, trimethylammoniumtetrakis(2,3,4,6-tetrafluorophenyl)borate, triethylammonium tetrakis(2,3,4,6-tetrafluorophenyl) borate, tripropylammonium tetrakis(2,3,4,6-tetrafluorophenyl)borate, tri (n-butyl) ammonium tetrakis(2,3,4,6-, tetrafluorophenyl) borate, dimethyl(t-butyl) ammonium tetrakis(2,3,4,6-tetrafluorophenyl)borate, N,N-dimethylanilinium tetrakis(2,3,4,6-tetrafluorophenyl)borate, N,N-diethylanilinium tetrakis(2,3,4,6-tetrafluorophenyl)borate and N,N-dimethyl-(2,4,6-trimethylanilinium)tetrakis-(2,3,4,6-tetrafluorophenyl)borate; a borate-based compound of a dialkyl ammonium salt type such as dioctadecylammonium tetrakis(pentafluorophenyl) borate, ditetradecylammonium tetrakis(pentafluorophenyl) borate and dicyclohexylammonium tetrakis(pentafluorophenyl)borate; or a borate-based compound of a trisubstituted phosphonium salt type such as triphenylphosphonium tetrakis(pentafluorophenyl)borate, methyldioctadecylphosphonium tetrakis(pentafluorophenyl) borate and tri(2,6-, dimethylphenyl)phosphoniumtetrakis (pentafluorophenyl)borate, without limitation.

By using such a co-catalyst, the molecular weight distribution of the ethylene/alpha-olefin copolymer finally prepared may become more uniform, and polymerization activity may be improved.

The co-catalyst may be used in a suitable amount so that the activation of the transition metal compounds of Formula 1 and/or Formula 2 may be sufficiently achieved.

In the present invention, the transition metal compounds of Formula 1 and/or Formula 2 may be used in a supported type on a support.

In case where the transition metal compounds of Formula 1 and/or Formula 2 are supported by the support, the weight ratio of the transition metals and the support may be 1:10 to 1:1,000, more particularly, 1:10 to 1:500. If the support and the transition metal compounds are included in a weight ratio in the above range, optimized type may be shown. In addition, if the co-catalyst is supported together by the support, the weight ratio of the co-catalyst and the support may be 1:1 to 1:100, more particularly, 1:1 to 1:50. If the co-catalyst and the support are included in the weight ratio, catalyst activity may be improved, and the microstructure of a polymer prepared may be optimized.

Meanwhile, silica, alumina, magnesia or mixtures thereof may be used as the support, or these materials may be used after drying at a high temperature to remove moisture at the surface and in a state including a hydroxyl group or siloxane group which has high reactivity at the surface. Also, the dried support at a high temperature may further include an oxide, a carbonate, a sulfate or a nitrate component such as $Na_2O$, $K_2CO_3$, $BaSO_4$ and $Mg(NO_3)_2$.

The drying temperature of the support is preferably, from 200 to 800° C., more preferably, from 300 to 600° C., most preferably, from 300 to 400° C. If the drying temperature of the support is less than 200° C., humidity is too high and moisture at the surface may react with the co-catalyst, and if the temperature is greater than 800° C., the pores at the surface of the support may be combined to decrease the surface area, and a large amount of the hydroxyl groups at the surface may be removed to remain only siloxane groups to decrease reaction sites with the co-catalyst, undesirably.

In addition, the amount of the hydroxyl group at the surface of the support may preferably be 0.1 to 10 mmol/g, more preferably, 0.5 to 5 mmol/g. The amount of the hydroxyl group at the surface of the support may be controlled by the preparation method and conditions of the support, or drying conditions, for example, temperature, time, vacuum or spray drying.

In addition, an organoaluminum compound may be further injected for removing moisture in a reactor during polymerization reaction, and the polymerization reaction may be performed in the presence thereof. Particular examples of such organoaluminum compound may include trialkylaluminum, dialkylaluminum halide, alkyl aluminum dihalide, aluminum dialkyl hydride or alkyl aluminum sesqui halide, and more particular examples may include $Al(C_2H_5)_3$, $Al(C_2H_5)_2H$, $Al(C_3H_7)_3$, $Al(C_3H_7)_2H$, $Al(i-C_4H_9)_2H$, $Al(C_8H_{17})_3$, $Al(C_{12}H_{25})_3$, $Al(C_2H_5)(C_{12}H_{25})_2$, $Al(i-C_4H_9)(C_{12}H_{25})_2$, $Al(i-C_4H_9)_2H$, $Al(i-C_4H_9)_3$, $(C_2H_5)_2AlCl$, $(i-C_3H_9)_2AlCl$, $(C_2H_5)_3Al_2Cl_3$, etc. Such organoaluminum compound may be continuously injected into a reactor, or may be injected in a ratio of about 0.1 to 10 mol per 1 kg of a reaction medium injected into the reactor for suitable removal of moisture.

In addition, a polymerization pressure may be about 1 to about 100 Kgf/cm$^2$, preferably, about 1 to about 50 Kgf/cm$^2$, more preferably, about 5 to about 30 Kgf/cm$^2$.

Also, if the transition metal compound is used in a supported type by a support, the transition metal compound may be injected after being dissolved or diluted in an aliphatic hydrocarbon solvent of 5 to 12 carbon atoms, for example, pentane, hexane, heptane, nonane, decane, and isomers thereof, an aromatic hydrocarbon solvent such as toluene and benzene, or a hydrocarbon solvent substituted with a chlorine atom such as dichloromethane and chlorobenzene. The solvent used is preferably used after treating with a small amount of alkyl aluminum to remove a small amount of water or air, which acts as a catalyst poison, and may be used by using a co-catalyst further.

[Encapsulant Film and Solar Cell Module]

In addition, the composition for an encapsulant film of the present invention may be included in an encapsulant film and used.

The encapsulant film of the present invention may be prepared by molding the composition for an encapsulant film into a film or sheet shape. The molding method is not specifically limited, for example, a sheet or a film may be formed by a common process such as a T die process and extrusion. For example, the manufacture of the encapsulant film may be performed in situ using an apparatus in which the preparation of a modified resin composition using the composition for an encapsulant film and a process for forming a film or a sheet are connected.

The thickness of the encapsulant film may be controlled to about 10 to 2,000 μm, or about 100 to 1,250 μm considering the supporting efficiency and breaking possibility of a device in an optoelectronic device, the reduction of the weight or workability of the device, and may be changed according to the particular use thereof.

In addition, the present invention provides a solar cell module including the encapsulant film. In the present invention, the solar cell module may have a configuration in which the gaps between the solar cells disposed in series or in parallel are filled with the encapsulant film of the present invention, a glass surface is disposed on a side where the sunlight strikes, and a backside is protected by a back sheet, but is not limited thereto. Various types and shapes of the solar cell modules manufactured by including the encapsulant film in this technical field may be applied in the present invention.

The glass surface may use tempered glass for protecting the solar cells from external impact and preventing breaking, and may use low iron tempered glass having low iron content to prevent the reflection of the sunlight and to increase the transmittance of the sunlight, without limitation.

The back sheet is a climate-resistant film protecting the backside of the solar cell module from exterior, for example, a fluorine-based resin sheet, a metal plate or metal film such as aluminum, a cyclic olefin-based resin sheet, a polycarbonate-based resin sheet, a poly(meth)acryl-based resin sheet, a polyamide-based resin sheet, a polyester-based resin sheet, a laminated composite sheet of a climate-resistant film and a barrier film, etc., without limitation.

Besides, the solar cell module of the present invention may be manufactured by any methods well-known in this technical field only if including the encapsulant film, without limitation.

The solar cell module of the present invention is manufactured using an encapsulant film having excellent volume resistance, and the leakage of current outside through the movement of electrons in the solar cell module may be prevented through the encapsulant film. Accordingly, potential induced degradation phenomenon (PID) by which insulation is degraded, leakage current is generated, and the output of the module is rapidly degraded, may be largely restrained.

EXAMPLES

Hereinafter, the present invention will be explained in more detail referring to embodiments. However, the embodiments are provided only for illustration, and the scope of the present invention is not limited thereto.

[Preparation of Transition Metal Compound]

Synthetic Example 1

(1) Preparation of Ligand Compound

Synthesis of N-tert-butyl-1-(1,2-dimethyl-3H-benzo[b]cyclopenta[d]thiophen-3-yl)-1,1-dimethylsilanamine To a 100 ml schlenk flask, 4.65 g (15.88 mmol) of chloro(1,2-dimethyl-6,7-dihydro-3H-benzo[b]cyclopenta[d]thiophene-3-yl)dimethylsilane was weighed and added, and 80 ml of THF was injected thereto. At room temperature, tBuNH$_2$ (4 eq, 6.68 ml) was injected thereto and reacted at room temperature for 3 days. After finishing the reaction, THF was removed, and the resultant reaction product was filtered with hexane. After drying solvents, 4.50 g (86%) of a yellow liquid was obtained.

$^1$H-NMR (in CDCl$_3$, 500 MHz): 7.99 (d, 1H), 7.83 (d, 1H), 7.35 (dd, 1H), 7.24 (dd, 1H), 3.49 (s, 1H), 2.37 (s, 3H), 2.17 (s, 3H), 1.27 (s, 9H), 0.19 (s, 3H), −0.17 (s, 3H).

(2) Preparation of Transition Metal Compound

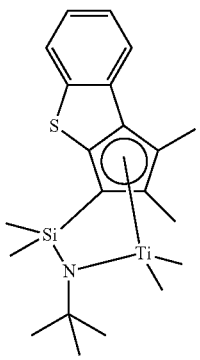

[Formula 1-1]

To a 50 ml schlenk flask, the ligand compound (1.06 g, 3.22 mmol/1.0 eq) and 16.0 ml (0.2 M) of MTBE were put and stirred first. n-BuLi (2.64 ml, 6.60 mmol/2.05 eq, 2.5 M in THF) was added thereto at −40° C. and reacted at room temperature overnight. After that, MeMgBr (2.68 ml, 8.05 mmol/2.5 eq, 3.0 M in diethyl ether) was slowly added thereto dropwisely at −40° C., and TiCl$_4$ (2.68 ml, 3.22 mmol/1.0 eq, 1.0 M in toluene) was put in order, followed by reacting at room temperature overnight. After that, the reaction mixture was passed through celite using hexane for filtration. After dying the solvents, 1.07 g (82%) of a brown solid was obtained.

$^1$H-NMR (in CDCl$_3$, 500 MHz): 7.99 (d, 1H), 7.68 (d, 1H), 7.40 (dd, 1H), 7.30 (dd, 1H), 3.22 (s, 1H), 2.67 (s, 3H), 2.05 (s, 3H), 1.54 (s, 9H), 0.58 (s, 3H), 0.57 (s, 3H), 0.40 (s, 3H), −0.45 (s, 3H).

Synthetic Example 2

(1) Preparation of Ligand Compound

Synthesis of N-tert-butyl-1-(1,2-dimethyl-3H-benzo[b]cyclopenta[d]thiophene-3-yl)-1,1-(2-ethylphenyl)(methyl)silaneamine (i) Preparation of chloro-1-(1,2-dimethyl-3H-benzo[b]cyclopenta[d]thiophene-3-yl)-1,1-(2-ethylphenyl)(methyl)silane To a 100 ml schlenk flask, 2 g (1 eq, 9.99 mmol) of 1,2-dimethyl-3H-benzo[b]cyclopenta[d]thiophene and 50 ml of THF were put, and 4 ml (1 eq, 9.99 mmol, 2.5 M in hexane) of n-BuLi was added thereto dropwisely at −30° C., followed by stirring at room temperature overnight. A stirred Li-complex THF solution was cannulated into a schlenk flask containing 2.19 ml (1.0 eq, 9.99 mmol) of dichloro(2-ethylphenyl)(methyl)silane and 50 ml of THF at −78° C., followed by stirring at room temperature overnight. After stirring, drying in vacuum was carried out and extraction with 60 ml of hexane was carried out. After drying in vacuum again and washing with hexane, 3.83 g (99%, dr=1:1) of an ivory solid was obtained.

(ii) Preparation of N-tert-butyl-1-(1,2-dimethyl-3H-benzo[b]cyclopenta[d]thiophene-3-yl)-1,1-(2-ethylphenyl)(methyl)silaneamine To a 100 ml round flask, 3.87 g (10.1 mmol) of chloro-1-(1,2-dimethyl-3H-benzo[b]cyclopenta[d]thiophene-3-yl)-1,1-(2-ethylphenyl)(methyl)silane was weighed and added, and 40 ml of hexane was injected thereto. At room temperature, t-BuNH$_2$ (10 eq, 10.5 mL) was injected and reacted at room temperature for 2 days. After the reaction, hexane was removed, and filtering with hexane was carried out. After drying the solvents, 3.58 g (84.4%, dr=1:0.8) of a yellow solid was obtained.

$^1$H-NMR (CDCl$_3$, 500 MHz): δ 7.98 (t, 2H), 7.71 (d, 1H), 7.55 (d, 1H), 7.52 (d, 1H), 7.48 (d, 1H), 7.30 (t, 1H), 7.26-7.22 (m, 3H), 7.19 (dd, 2H), 7.12-7.06 (m, 3H), 7.00 (t, 1H), 3.08-2.84 (m, 4H) 3.05-2.84 (m, 2H), 2.28 (s, 3H), 2.20 (s, 3H), 2.08 (s, 3H), 1.62 (s, 3H), 1.26-1.22 (m, 6H), 1.06 (s, 9H), 0.99 (s, 9H), 0.05 (s, 3H), −0.02 (s, 3H).

(2) Preparation of Transition Metal Compound

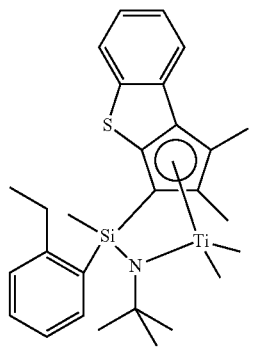

[Formula 2-5]

To a 50 ml vial, the ligand compound (1.74 g, 4.14 mmol/1.0 eq) and 20.7 ml (0.2 M) of toluene were put and stirred. n-BuLi (3.48 ml, 8.7 mmol/2.1 eq, 2.5M in hexane) was added thereto at −40° C. and stirred at room temperature overnight. Then, MeMgBr (4.14 ml, 12.42 mmol/3.0 eq, 3.0 M in diethyl ether) was added thereto dropwisely at −40° C., and TiCl$_4$DME (1.1 g, 4.14 mmol/1.0 eq) was put in order, followed by stirring at room temperature overnight. After drying the solvents, the reaction mixture was filtered using hexane. Then, DME (1.29 ml, 12.42 mmol/3.0 eq) was added to the filtrate and stirred at room temperature overnight. After drying the solvents, the resultant product was filtered using hexane to obtain 335 mg (16.3%, dr=1:0.8) of a yellow solid.

$^1$H NMR (CDCl$_3$, 500 MHz): δ 7.90 (d, 1H), 7.85 (d, 1H), 7.74 (d, 1H), 7.71 (d, 1H), 7.40 (d, 1H), 7.37 (d, 1H), 7.27 (d, 1H), 7.23 (t, 2H), 7.17 (t, 2H), 7.13 (t, 2H), 7.06 (t, 1H), 7.01 (t, 1H), 6.86 (t, 1H), 2.97-2.91 (m, 2H), 2.90-2.82 (m, 2H), 2.33 (s, 3H), 2.22 (s, 3H), 1.96 (s, 3H), 1.68 (s, 9H), 1.66 (s, 9H), 1.38 (s, 3H), 1.32 (t, 3H), 1.24 (t, 3H), 1.07 (s, 3H), 0.88 (s, 3H), 0.85 (s, 3H), 0.72 (s, 3H), 0.19 (s, 3H), 0.01 (s, 3H).

Synthetic Example 3

(1) Preparation of Ligand Compound

Synthesis of N-tert-butyl-1-(1,2-dimethyl-3H-benzo[b]cyclopenta[d]thiophene-3-yl)-1,1-(methyl)(2-methylphenyl)silaneamine (i) Preparation of chloro-1-(1,2-dimethyl-3H-benzo[b]cyclopenta[d]thiophene-3-yl)-1,1-(methyl)(2-methylphenyl)silane To a 250 ml schlenk flask, 2.0 g (1.0 eq, 9.985 mmol) of 1,2-dimethyl-3H-benzo[b]cyclopenta[d]thiophene and 50 ml of THF were put, and 4.2 ml (1.05 eq, 10.484 mmol, 2.5

M in hexane) of n-BuLi was added thereto dropwisely at −30° C., followed by stirring at room temperature overnight. A stirred Li-complex THF solution was cannulated into a schlenk flask containing 2.46 g (1.2 eq, 11.982 mmol) of dichloro(o-tolylmethyl)silane and 30 ml of THF at −78° C., followed by stirring at room temperature overnight. After stirring, drying in vacuum was carried out, and extraction with 100 ml of hexane was carried out.

(ii) Preparation of N-tert-butyl-1-(1,2-dimethyl-3H-benzo[b]cyclopenta[d]thiophene-3-yl)-1,1-(methyl)(2-methylphenyl)silaneamine After stirring 4.0 g (1.0 eq, 10.0 mmol) of the extracted chloro-1-(1,2-dimethyl-3H-benzo[b]cyclopenta[d]thiophene-3-yl)-1,1-(methyl)(2-methylphenyl)silane in 10 ml of hexane, 4.2 ml (4.0 eq, 40.0 mmol) of t-BuNH$_2$ was injected at room temperature, followed by stirring at room temperature overnight. After stirring, drying in vacuum was carried out, and extraction with 150 ml of hexane was carried out. After drying the solvents, 4.26 g (99%, dr=1:0.83) of a sticky liquid was obtained.

$^1$H-NMR (CDCl$_3$, 500 MHz): δ 7.95 (t, 2H), 7.70 (d, 1H), 7.52 (d, 1H), 7.47-7.44 (m, 2H), 7.24-7.02 (m, 9H), 6.97 (t, 1H), 3.59 (s, 1H), 3.58 (s, 1H), 2.50 (s, 3H), 2.44 (s, 3H), 2.25 (s, 3H), 2.16 (s, 3H), 2.06 (s, 3H), 1.56 (s, 3H), 1.02 (s, 9H), 0.95 (s, 9H), −0.03 (s, 3H), −0.11 (s, 3H).

(2) Preparation of Transition Metal Compound

[Formula 2-3]

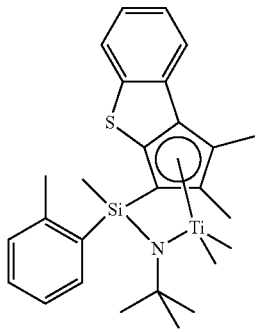

To a 250 ml round flask, the ligand compound (4.26 g, 10.501 mmol) was put in 53 ml (0.2 M) of MTBE and stirred. n-BuLi (8.6 ml, 21.52 mmol, 2.05 eq, 2.5M in hexane) was added thereto at −40° C. and stirred at room temperature overnight.

Then, MeMgBr (8.8 ml, 26.25 mmol, 2.5 eq, 3.0 M in diethyl ether) was slowly added thereto dropwisely at −40° C., and TiCl$_4$ (10.50 ml, 10.50 mmol) was put in order, followed by stirring at room temperature overnight. After that, the reaction mixture was filtered using hexane. DME (3.3 ml, 31.50 mmol) was added to the filtrate, and the resultant solution was filtered using hexane and concentrated to obtain 3.42 g (68%, dr=1:0.68) of a yellow solid.

$^1$H NMR (CDCl$_3$, 500 MHz): δ 7.83 (d, 1H), 7.80 (d, 1H), 7.74 (d, 1H), 7.71 (d, 1H), 7.68 (d, 1H), 7.37 (d, 1H), 7.31-6.90 (m, 9H), 6.84 (t, 1H), 2.54 (s, 3H), 2.47 (s, 3H), 2.31 (s, 3H), 2.20 (s, 3H), 1.65 (s, 9H), 1.63 (s, 9H), 1.34 (s, 3H), 1.00 (s, 3H), 0.98 (s, 3H), 0.81 (s, 3H), 0.79 (s, 3H), 0.68 (s, 3H), 0.14 (s, 3H), −0.03 (s, 3H).

Synthetic Example 4

(1) Preparation of Ligand Compound

Synthesis of N-tert-butyl-1-(1,2-dimethyl-3H-benzo[b]cyclopenta[d]thiophene-3-yl)-1,1-(methyl)(phenyl)silaneamine (i) Preparation of chloro-1-(1,2-dimethyl-3H-benzo[b]cyclopenta[d]thiophene-3-yl)-1,1-(methyl)(phenyl) silane To a 250 ml schlenk flask, 10 g (1.0 eq, 49.925 mmol) of 1,2-dimethyl-3H-benzo[b]cyclopenta[d]thiophene and 100 ml of THF were put, and 22 ml (1.1 eq, 54.918 mmol, 2.5 M in hexane) of n-BuLi was added thereto dropwisely at −30° C., followed by stirring at room temperature for 3 hours. A stirred Li-complex THF solution was cannulated into a schlenk flask containing 8.1 ml (1.0 eq, 49.925 mmol) of dichloro(methyl)(phenyl)silane and 70 ml of THF at −78° C., followed by stirring at room temperature overnight. After stirring, drying in vacuum was carried out, and extraction with 100 ml of hexane was carried out.

(ii) Preparation of N-tert-butyl-1-(1,2-dimethyl-3H-benzo[b]cyclopenta[d]thiophene-3-yl)-1,1-(methyl)(phenyl)silaneamine After injecting 42 ml (8 eq, 399.4 mmol) of t-BuNH$_2$ to 100 ml of the extracted chloro-1-(1,2-dimethyl-3H-benzo[b]cyclopenta[d]thiophene-3-yl)-1,1-(methyl)(phenyl)silane hexane solution, stirring was performed at room temperature overnight. After stirring, drying in vacuum was carried out, and extraction with 150 ml of hexane was carried out. After drying the solvents, 13.36 g (68%, dr=1:1) of a yellow solid was obtained.

$^1$H NMR (CDCl$_3$, 500 MHz): δ 7.93 (t, 2H), 7.79 (d, 1H), 7.71 (d, 1H), 7.60 (d, 2H), 7.48 (d, 2H), 7.40-7.10 (m, 10H, aromatic), 3.62 (s, 1H), 3.60 (s, 1H), 2.28 (s, 6H), 2.09 (s, 3H), 1.76 (s, 3H), 1.12 (s, 18H), 0.23 (s, 3H), 0.13 (s, 3H).

(2) Preparation of Transition Metal Compound

[Formula 2-4]

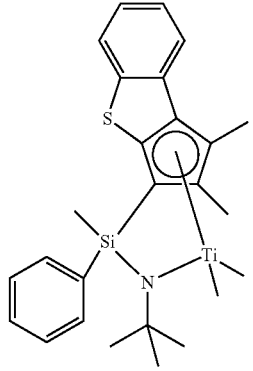

To a 100 ml schlenk flask, 4.93 g (12.575 mmol, 1.0 eq) of the ligand compound and 50 ml (0.2 M) of toluene were put, and 10.3 ml (22.779 mmol, 2.05 eq, 2.5M in hexane) of n-BuLi was added thereto dropwisely at −30° C., followed by stirring at room temperature overnight. After stirring, 12.6 ml (37.725 mmol, 3.0 eq, 3.0 M in diethyl ether) of MeMgBr was added thereto dropwisely, and 13.2 ml (13.204 mmol, 1.05 eq, 1.0 M in toluene) of TiCl$_4$ was put in order, followed by stirring at room temperature overnight. After stirring, the reaction product was dried in vacuum and extracted with 150 ml of hexane. The solvents were removed to 50 ml, and 4 ml (37.725 mmol, 3.0 eq) of DME was added dropwisely and stirred at room temperature overnight. After drying again in vacuum and extracting with 150 ml of hexane, 2.23 g (38%, dr=1:0.5) of a brown solid was obtained.

$^1$H NMR (CDCl$_3$, 500 MHz): δ 7.98 (d, 1H), 7.94 (d, 1H), 7.71 (t, 6H), 7.50~7.30 (10H), 2.66 (s, 3H), 2.61 (s, 3H), 2.15 (s, 3H), 1.62 (s, 9H), 1.56 (s, 9H), 1.53 (s, 3H), 0.93 (s, 3H), 0.31 (s, 3H), 0.58 (s, 3H), 0.51 (s, 3H), −0.26 (s, 3H), −0.39 (s, 3H).

Comparative Synthetic Example 1

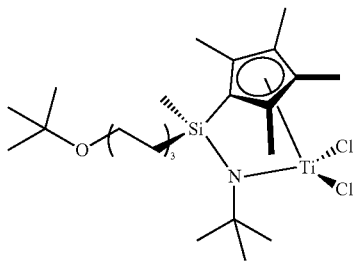

The compound above was synthesized according to a method described in PCT Publication WO 2016-186295 A1 and then, used.

[Preparation of Ethylene/Alpha-Olefin Copolymer]

Preparation Example 1

While injecting a hexane solvent in 5.0 kg/h and 1-butene in 0.76 kg/h, a 1.5 L continuous process reactor was preheated to 130° C. A triisobutylaluminum compound (0.045 mmol/min), a mixture (0.120 μmol/min) of the transition metal compounds obtained in Synthetic Examples 1 and 2 in a molar ratio of 3:7, and a dimethylanilinium tetrakis(pentafluorophenyl)borate co-catalyst (0.144 μmol/min) were put in the reactor at the same time. Then, into the reactor, ethylene (0.87 kg/h) and a hydrogen gas (20 cc/min) were injected and copolymerization reaction was continuously carried out while maintaining a pressure of 89 bar and 130.1° C. for 60 minutes or more to prepare a copolymer. After drying for 12 hours or more in a vacuum oven, physical properties were measured.

Preparation Examples 2 to 4, and Comparative Examples 1 to 7

Ethylene/alpha-olefin copolymers were prepared by the same method as in Preparation Example 1 except for changing polymerization conditions as shown in Table 1 below.

The copolymers thus obtained were dried in vacuum, yields were measured, and the results are shown in Table 1 below.

TABLE 1

| | Catalyst type | Catalyst mixing ratio | Cat. μmol/min | Co-cat. μmol/min | Tibal mmol/min | C2 | 1-C4 kg/h | C6 | Hydrogen cc/min | Temp. ° C. | Yield g/min |
|---|---|---|---|---|---|---|---|---|---|---|---|
| Preparation Example 1 | Synthetic Example 1 + Synthetic Example 2 | 3:7 | 0.120 | 0.144 | 0.045 | 0.87 | 0.76 | 5.0 | 20 | 130.1 | 10.8 |
| Preparation Example 2 | Synthetic Example 1 + Synthetic Example 3 | 3:7 | 0.120 | 0.144 | 0.058 | 0.87 | 0.92 | 5.0 | 22 | 130.9 | 10.8 |
| Preparation Example 3 | Synthetic Example 1 + Synthetic Example 4 | 3:7 | 0.110 | 0.220 | 0.045 | 0.87 | 0.85 | 5.0 | 12 | 136.1 | 12.2 |
| Preparation Example 4 | Synthetic Example 1 + Synthetic Example 4 | 3:7 | 0.151 | 0.144 | 0.035 | 0.87 | 0.82 | 5.0 | 34 | 131.7 | 11.1 |
| Comparative Preparation Example 1 | Synthetic Example 1 | — | 0.125 | 0.147 | 0.045 | 0.87 | 0.80 | 5.0 | 15 | 130.3 | 10.2 |
| Comparative Preparation Example 2 | Synthetic Example 1 | — | 0.550 | 1.650 | 0.090 | 0.87 | 1.25 | 7.0 | 50 | 153.1 | 14.8 |
| Comparative Preparation Example 3 | Synthetic Example 2 | — | 0.120 | 0.144 | 0.040 | 0.87 | 070 | 5.0 | 23 | 130.1 | 9.8 |
| Comparative Preparation Example 4 | Synthetic Example 3 | — | 0.125 | 0.147 | 0.045 | 0.87 | 0.76 | 5.0 | 26 | 129.1 | 9.6 |
| Comparative Preparation Example 5 | Synthetic Example 4 | — | 0.125 | 0.147 | 0.045 | 0.87 | 0.76 | 5.0 | 26 | 130.4 | 10.7 |
| Comparative Preparation Example 6 | Comparative Synthetic Example 1 + Synthetic Example 2 | 5:5 | 0.120 | 0.188 | 0.035 | 0.87 | 1.00 | 5.0 | 8 | 131.7 | 11.9 |

TABLE 1-continued

|  | Catalyst type | Catalyst mixing ratio | Cat. μmol/min | Co-cat. μmol/min | Tibal mmol/min | C2 kg/h | 1-C4 | C6 | Hydrogen cc/min | Temp. ° C. | Yield g/min |
|---|---|---|---|---|---|---|---|---|---|---|---|
| Comparative Preparation Example 7 | Comparative Synthetic Example 1 + Synthetic Example 2 | 5:5 | 0.120 | 0.188 | 0.035 | 0.87 | 0.65 | 5.0 | 5 | 131.4 | 11.5 |

[Analysis of Ethylene/Alpha-Olefin Copolymer]

Experimental Example 1

With respect to the ethylene/alpha-olefin copolymers prepared in the Preparation Examples and Comparative Preparation Examples, physical properties were measured according to the methods below and are shown in Table 2.

(1) Density (g/cm$^3$)

Measurement was conducted according to ASTM D-792.

(2) Melt Index (MI$_{2.16}$, dg/min)

Measurement was conducted according to ASTM D-1238 (condition E, 190° C., 2.16 kg load).

(3) Melt Flow Rate Ratio (MFRR, MI$_{10}$/MI$_{2.16}$)

MI$_{10}$ (condition E, 190° C., 10 kg load) and MI$_{2.16}$ (condition E, 190° C., 2.16 kg load) were measured according to ASTM D-1238 and MI$_{10}$/MI$_{2.16}$ was calculated.

(4) Melting Temperature (Tm) and Crystallization Temperature (Tc)

Melting temperature (Tm) and crystallization temperature (Tc) could be obtained using differential scanning calorimeter (DSC 6000), and particularly, under a nitrogen atmosphere using DSC, the temperature of a copolymer was elevated to 200° C., maintained for 5 minutes, decreased to 30° C., and elevated again, and a DSC curve was observed. In this case, the temperature elevating rate and decreasing rate were 10° C./min, respectively.

In the measured DSC curve, the melting temperature was the maximum point of an endothermic peak during the second temperature elevation, and the crystallization temperature was determined as the maximum point of an exothermal peak during decreasing the temperature.

(5) Weight Average Molecular Weight (Mw) and Molecular Weight Distribution (MWD)

A weight average molecular weight (Mw) and a number average molecular weight (Mn) of the copolymer prepared were measured under analysis conditions of gel permeation chromatography (GPC) below, and the molecular weight distribution (MWD) was calculated from the ratio of Mw/Mn.

Column: Agilent Olexis
Solvent: Trichlorobenzene
Flow rate: 1.0 ml/min
Specimen concentration: 1.0 mg/ml
Injection amount: 200 μl
column temperature: 160° C.
Detector: Agilent High Temperature RI detector
Standard: Polystyrene (calibrated by cubic function)
Data processing: Cirrus (6) Full Width at Half Maximum (FWHM) of Crystallization Peak CFC of PolymerChar Co. was used as a measurement apparatus. First, a copolymer solution was completely dissolved using o-dichlorobenzene as a solvent at 130° C. for 60 minutes in an oven in a CFC analyzer, and then the solution was poured into a TREF column controlled to 130° C. Then, the column was cooled to 95° C. and stabilized for 45 minutes. Then, the temperature of the TREF column was decreased to −20° C. in a rate of 0.5° C./min and maintained at −20° C. for 10 minutes. After that, an elution amount (mass %) was measured using an infrared spectrophotometer. Then, the temperature of the TREF column was elevated in a rate of 20° C./min to a preset temperature and at the reached temperature, the temperature was maintained for a preset time (that is, about 27 minutes), and this work was repeated until the temperature of the TREF reached 130° C., and the amount (mass %) of an eluted fraction in each temperature range was measured. In addition, a molecular weight (Mw) was measured by the same GPC measurement principle except for sending the eluted fraction at each temperature to a GPC column and using o-dichlorobenzene as a solvent. A FWHM value was calculated after fitting an elution amount graph according to temperature (dW/dT vs T) obtained through CFC on a program (Origin) into a Gaussian curve shape.

TABLE 2

|  | Density g/cm$^3$ | MI dg/min | MFRR | Tm ° C. | Tc ° C. | Mw | MWD | FWHM |
|---|---|---|---|---|---|---|---|---|
| Preparation Example 1 | 0.878 | 5.8 | 6.2 | 64.1 | 47.0 | 80,000 | 1.98 | 18.7 |
| Preparation Example 2 | 0.877 | 6.1 | 6.1 | 62.2 | 47.5 | 70,000 | 2.00 | 18.3 |
| Preparation Example 3 | 0.877 | 4.8 | 6.5 | 62.4 | 45.1 | 80,000 | 1.97 | 20.2 |
| Preparation Example 4 | 0.878 | 14.6 | 5.9 | 66.1 | 50.4 | 68,000 | 1.96 | 20.9 |
| Comparative Preparation Example 1 | 0.877 | 5.0 | 6.6 | 60.5 | 45.5 | 80,000 | 2.05 | 13.8 |
| Comparative Preparation Example 2 | 0.878 | 500 | — | 74.9 | 59.1 | 23,000 | 2.11 | 22.1 |

TABLE 2-continued

|  | Density g/cm³ | MI dg/min | MFRR — | Tm ° C. | Tc ° C. | Mw — | MWD — | FWHM — |
|---|---|---|---|---|---|---|---|---|
| Comparative Preparation Example 3 | 0.878 | 5.6 | 5.9 | 62.0 | 47.5 | 82,000 | 1.96 | 12.5 |
| Comparative Preparation Example 4 | 0.878 | 5.0 | 5.8 | 61.2 | 46.3 | 83,000 | 1.94 | 13.1 |
| Comparative Preparation Example 5 | 0.877 | 5.8 | 6.1 | 60.7 | 45.8 | 81,000 | 1.94 | 14.0 |
| Comparative Preparation Example 6 | 0.878 | 5.6 | 6.9 | 71.6 | 51.0 | 74,000 | 2.36 | 20.1 |
| Comparative Preparation Example 7 | 0.902 | 5.1 | 7.2 | 105.0 | 80.1 | 75,000 | 2.27 | 19.0 |

As summarized in Table 2, it could be confirmed that Preparation Examples 1 to 4 on the ethylene/alpha-olefin copolymers according to the present invention showed high FWHM values of 15 or more and narrow molecular weight distribution, and satisfied the density and melt index in the ranges defined in the present invention. On the contrary, the ethylene/alpha-olefin copolymers of Comparative Preparation Examples 1 and 3 to 5 showed small FWHM values of less than 15, and this indicates narrow crystallinity distribution and high free volume ratios of the copolymers.

In addition, Comparative Preparation Example 2 showed a high melt index, Comparative Preparation Example 6 showed high molecular weight distribution, and Comparative Preparation Example 7 showed a high density, and it was confirmed that all were deviated from the ranges defined in the present invention.

[Manufacture of Encapsulant Film]

Example 1

To 500 g of the sample of Preparation Example 1, 1 phr (parts per hundred rubber) of t-butyl 1-(2-ethylhexyl) monoperoxycarbonate (TBEC), 0.5 phr of triallylisocyanurate (TAIC), and 0.2 phr of methacryloxypropyltrimethoxysilane (MEMO) were injected to prepare a composition for an encapsulant film. Then, soaking was performed at 40° C. for 1 hour, and aging was performed for 15 hours.

After that, an encapsulant film having an average thickness of 450 μm was manufactured at a low temperature to a degree not achieving high-temperature crosslinking (conditions of 90° C. or less of extruder barrel temperature) using a micro extruder.

Examples 2 to 4, and Comparative Examples 1 to 7

Encapsulant films were manufactured by the same method as in Example 1 except for using the copolymers of Preparation Examples 2 to 4, and Comparative Preparation Examples 1 to 7 as samples, respectively.

[Analysis of Encapsulant Film]

Experimental Example 2

Between two release films (thickness: about 100 μm), the encapsulant film (15 cm×15 cm) with a thickness of 500 μm thus manufactured was put and crosslinked by lamination in a vacuum laminator at a process temperature of 150° C. for a process time of 19 minutes and 30 seconds (vacuum for 5 minutes/pressurizing for 1 minute/keeping pressure for 13 minutes and 30 seconds).

Then, volume resistance and total transmittance (Tt) were measured by the methods below and recorded in Table 3 below.

(1) Volume Resistance

Measurement was conducted by applying a voltage of 1000 V for 60 seconds using Agilent 4339B High-resistance meter (product of Agilent Technologies K.K.) under temperature conditions of 23±1° C. and humidity conditions of 50%±3.

(2) Light Transmittance

Light transmittance at 550 nm was measured using Shimadzu UV-3600 spectrophotometer.
measurement mode: transmittance
wavelength interval: 1 nm
measurement rate: medium

TABLE 3

|  | Volume resistance (Ω · cm) | Light transmittance (%) |
|---|---|---|
| Example 1 | $8.8 \times 10^{15}$ | 91.8 |
| Example 2 | $9.4 \times 10^{15}$ | 91.7 |
| Example 3 | $9.3 \times 10^{15}$ | 91.8 |
| Example 4 | $9.0 \times 10^{15}$ | 90.8 |
| Comparative Example 1 | $3.0 \times 10^{15}$ | 90.0 |
| Comparative Example 2 | $3.2 \times 10^{15}$ | 88.5 |
| Comparative Example 3 | $3.2 \times 10^{15}$ | 91.0 |
| Comparative Example 4 | $5.3 \times 10^{15}$ | 91.4 |
| Comparative Example 5 | $4.1 \times 10^{15}$ | 91.0 |
| Comparative Example 6 | $6.2 \times 10^{15}$ | 86.0 |
| Comparative Example 7 | $6.7 \times 10^{15}$ | 84.3 |

As shown in Table 3, it was confirmed that the encapsulant films of the Examples manufactured using the ethylene/alpha-olefin copolymers of the Preparation Examples, satisfying the conditions according to the present invention had higher volume resistance when compared with the Comparative Examples. Particularly, the encapsulant films of Comparative Examples 1, and 3 to 5 including the ethylene/alpha-olefin copolymers having small FWHM values, showed largely degraded volume resistance, and the encapsulant films of Comparative Examples 2, 6 and 7 using the ethylene/alpha-olefin copolymers not satisfying the melt index, molecular weight distribution and density, respectively, showed particularly low light transmittance as well as the volume resistance.

Like this, if an encapsulant film is manufactured using an ethylene/alpha-olefin copolymer satisfying all of the density, molecular weight distribution, melt index and FWHM value defined in the present invention, excellent levels of volume resistance and light transmittance may be achieved without using a separate additive.

[Manufacture and Analysis of Solar Cell Module]

Experimental Example 3

A solar cell module was manufactured using the encapsulant film (thickness of 500 μm) of Example 2 or Comparative Example 3, a fluorine-based back sheet, low iron tempered glass and a crystalline silicon solar cell. A solar cell module was manufactured by reducing the pressure of the arranged inside of the module at 150° C. conditions for 20 minutes using a vacuum laminator.

(1) Evaluation of Potential Induced Degradation (PID)

With respect to the solar cell module thus manufactured, initial output was measured, and after 288 hours at 85° C., 85% RH, and under −1,000 V, loss rate (%) in contrast to the initial output was calculated.

TABLE 4

|  | Loss rate in contrast to initial output (%) |
| --- | --- |
| Example 2 | 0.4 |
| Comparative Example 3 | 7.0 |

As described above, it could be found that since the volume resistance of the encapsulant film according to the present invention is excellent, if a solar cell module is manufactured using the same, the degradation of output due to PID phenomenon is largely prevented.

The invention claimed is:

1. A composition for an encapsulant film, the composition comprising an ethylene/alpha-olefin copolymer satisfying the following conditions (a) to (d):
   (a) a density is 0.85 to 0.89 g/cc;
   (b) a molecular weight distribution is 1.8 to 2.3;
   (c) a melt index (MI, 190° C., 2.16 kg load conditions) is 1 to 100 dg/min; and
   (d) a full width at half maximum (FWHM) of a crystallization peak shown during measuring a crystallization temperature by cross-fractionation chromatography (CFC) is 15 or more.

2. The composition for an encapsulant film according to claim 1, wherein the melt index of the ethylene/alpha-olefin copolymer is 2 to 20 dg/min.

3. The composition for an encapsulant film according to claim 1, wherein the full width at half maximum of the crystallization peak of the ethylene/alpha-olefin copolymer is 16 to 50.

4. The composition for an encapsulant film according to claim 1, wherein a melting temperature of the ethylene/alpha-olefin copolymer is 70° C. or less.

5. The composition for an encapsulant film according to claim 1, wherein a weight average molecular weight (Mw) of the ethylene/alpha-olefin copolymer is 40,000 to 150,000 g/mol.

6. The composition for an encapsulant film according to claim 1, wherein the ethylene/alpha-olefin copolymer has a melt flow rate ratio (MFRR, $MI_{10}/MI_{2.16}$) which is a value of a melt index ($MI_{10}$, 190° C., 10 kg load conditions) with respect to a melt index ($MI_{2.16}$, 190° C., 2.16 kg load conditions) of 8.0 or less.

7. The composition for an encapsulant film according to claim 1, wherein a crystallization temperature of the ethylene/alpha-olefin copolymer is 70° C. or less.

8. The composition for an encapsulant film according to claim 1, wherein the alpha-olefin comprises one or more selected from the group consisting of propylene, 1-butene, 1-pentene, 4-methyl-1-pentene, 1-hexene, 1-heptene, 1-octene, 1-decene, 1-undecene, 1-dodecene, 1-tetradecene, 1-hexadecene and 1-eicosene.

9. The composition for an encapsulant film according to claim 1, wherein the alpha-olefin is comprised in greater than 0 to 99 mol % with respect to the ethylene/alpha-olefin copolymer.

10. The composition for an encapsulant film according to claim 1, further comprising one or more selected from the group consisting of an unsaturated silane compound, an amino silane compound, a crosslinking agent, a crosslinking auxiliary agent, a light stabilizer, a UV absorbent and a thermal stabilizer.

11. An encapsulant film comprising the composition for an encapsulant film according to claims 1.

12. A solar cell module comprising the encapsulant film of claim 11.

13. A method for preparing the composition for an encapsulant film according to claim 1, the method comprising polymerizing ethylene and an alpha-olefin-based monomer in the presence of a catalyst composition including a transition metal compound represented by the following Formula 1 and a transition metal compound represented by the following Formula 2 to prepare the ethylene/alpha-olefin copolymer; and mixing the ethylene/alpha-olefin copolymer with a crosslinking agent, a crosslinking auxiliary agent and a silane coupling agent,

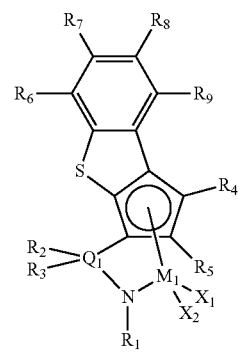

[Formula 1]

in Formula 1,
$R_1$ is hydrogen; alkyl of 1 to 20 carbon atoms; cycloalkyl of 3 to 20 carbon atoms; alkenyl of 2 to 20 carbon atoms; alkoxy of 1 to 20 carbon atoms; aryl of 6 to 20 carbon atoms; arylalkoxy of 7 to 20 carbon atoms; alkylaryl of 7 to 20 carbon atoms; or arylalkyl of 7 to 20 carbon atoms,
$R_2$ and $R_3$ are each independently hydrogen; halogen; alkyl of 1 to 20 carbon atoms; cycloalkyl of 3 to 20 carbon atoms; alkenyl of 2 to 20 carbon atoms; arylalkyl of 7 to 20 carbon atoms; alkylamido of 1 to 20 carbon atoms; or arylamido of 6 to 20 carbon atoms, $R_4$ and $R_5$ are each independently hydrogen; alkyl of 1 to 20 carbon atoms; cycloalkyl of 3 to 20 carbon atoms; aryl of 6 to 20 carbon atoms; or alkenyl of 2 to 20 carbon atoms, $R_6$ to $R_9$ are each independently hydrogen; alkyl of 1 to 20 carbon atoms; cycloalkyl of 3 to 20 carbon atoms; aryl of 6 to 20 carbon atoms; or alkenyl of 2 to 20 carbon atoms, or two or more adjacent groups among $R_6$ to $R_9$ are optionally connected with each other to form a ring, $Q_1$ is Si, C, N, P or S, $M_1$ is Ti, Hf or Zr, and $X_1$ and $X_2$ are each independently hydrogen; halogen; alkyl of 1 to 20 carbon atoms; alkenyl of 2 to 20 carbon atoms; aryl of 6 to 20 carbon atoms; alkylaryl of 7 to 20 carbon atoms; arylalkyl of 7 to 20 carbon atoms; alkylamino of 1 to 20 carbon atoms; or arylamino of 6 to 20 carbon atoms,

[Formula 2]

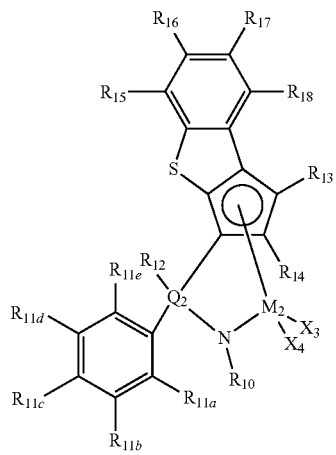

in Formula 2, $R_{10}$ is hydrogen; alkyl of 1 to 20 carbon atoms; cycloalkyl of 3 to 20 carbon atoms; alkenyl of 2 to 20 carbon atoms; alkoxy of 1 to 20 carbon atoms; aryl of 6 to 20 carbon atoms; arylalkoxy of 7 to 20 carbon atoms; alkylaryl of 7 to 20 carbon atoms; or arylalkyl of 7 to 20 carbon atoms, $R_{11a}$ to $R_{11e}$ are each independently hydrogen; halogen; alkyl of 1 to 20 carbon atoms;

cycloalkyl of 3 to 20 carbon atoms; alkenyl of 2 to 20 carbon atoms; alkoxy of 1 to 20 carbon atoms; or aryl of 6 to 20 carbon atoms, $R_{12}$ is hydrogen; halogen; alkyl of 1 to 20 carbon atoms; cycloalkyl of 3 to 20 carbon atoms; alkenyl of 2 to 20 carbon atoms; aryl of 6 to 20 carbon atoms; alkylaryl of 7 to 20 carbon atoms; arylalkyl of 7 to 20 carbon atoms; alkylamido of 1 to 20 carbon atoms; or arylamido of 6 to 20 carbon atoms, $R_{13}$ and $R_{14}$ are each independently hydrogen; alkyl of 1 to 20 carbon atoms; cycloalkyl of 3 to 20 carbon atoms; aryl of 6 to 20 carbon atoms; or alkenyl of 2 to 20 carbon atoms, $R_{15}$ to $R_{18}$ are each independently hydrogen; alkyl of 1 to 20 carbon atoms; cycloalkyl of 3 to 20 carbon atoms; aryl of 6 to 20 carbon atoms; or alkenyl of 2 to 20 carbon atoms, or two or more adjacent groups among $R_{15}$ to $R_{18}$ are optionally connected with each other to form a ring, $Q_2$ is Si, C, N, P or S, $M_2$ is Ti, Hf or Zr, and $X_3$ and $X_4$ are each independently hydrogen; halogen; alkyl of 1 to 20 carbon atoms; alkenyl of 2 to 20 carbon atoms; aryl of 6 to 20 carbon atoms; alkylaryl of 7 to 20 carbon atoms; arylalkyl of 7 to 20 carbon atoms; alkylamino of 1 to 20 carbon atoms; or arylamino of 6 to 20 carbon atoms.

14. The method according to claim 13, wherein a molar ratio of the transition metal compound represented by Formula 1 and the transition metal compound represented by Formula 2 is 1:0.8 to 1:10.

15. The method according to claim 13, wherein hydrogen is injected at 5 to 100 cc/min.

* * * * *